US011336855B2

(12) United States Patent
Nonoshita

(10) Patent No.: US 11,336,855 B2
(45) Date of Patent: May 17, 2022

(54) ANALOG-DIGITAL CONVERTER, ANALOG-DIGITAL CONVERSION METHOD, AND IMAGING DEVICE

(71) Applicant: Sony Semiconductor Solutions Corporation, Kanagawa (JP)

(72) Inventor: Yuto Nonoshita, Kanagawa (JP)

(73) Assignee: Sony Semiconductor Solution Corporation, Kanagawa (JP)

( * ) Notice: Subject to any disclaimer, the term of this patent is extended or adjusted under 35 U.S.C. 154(b) by 0 days.

(21) Appl. No.: 15/734,348

(22) PCT Filed: May 8, 2019

(86) PCT No.: PCT/JP2019/018329
§ 371 (c)(1),
(2) Date: Dec. 2, 2020

(87) PCT Pub. No.: WO2019/239746
PCT Pub. Date: Dec. 19, 2019

(65) Prior Publication Data
US 2021/0227162 A1  Jul. 22, 2021

(30) Foreign Application Priority Data
Jun. 13, 2018  (JP) .............................. JP2018-112496

(51) Int. Cl.
*H04N 5/378*  (2011.01)
*H03M 1/56*  (2006.01)
*H04N 5/3745*  (2011.01)

(52) U.S. Cl.
CPC .............. *H04N 5/378* (2013.01); *H03M 1/56* (2013.01); *H04N 5/37455* (2013.01)

(58) Field of Classification Search
CPC combination set(s) only.
See application file for complete search history.

(56) References Cited

U.S. PATENT DOCUMENTS

| 8,803,993 | B2* | 8/2014 | Koseki | ................. H04N 5/3742 348/222.1 |
| 2009/0225211 | A1* | 9/2009 | Oike | .................... H04N 5/3745 348/308 |

(Continued)

FOREIGN PATENT DOCUMENTS

| JP | 2011-35532 A | 2/2011 |
| JP | 2011-172119 A | 9/2011 |

OTHER PUBLICATIONS

International Search Report, International Application No. PCT/JP2019/018329, dated Jul. 29, 2019.

*Primary Examiner* — Nhan T Tran
(74) *Attorney, Agent, or Firm* — Michael Best & Friedrich LLP

(57) ABSTRACT

An analog-digital converter that includes voltage acquisition circuitry that acquires a voltage value of an analog signal in a settling period, calculation circuitry that calculates a predicted convergence voltage value of the analog signal based on the voltage value of the acquired analog signal, reference signal generation circuitry that generates a ramp wave reference signal based on the predicted convergence voltage value, comparison circuitry that compares the voltage value of the analog signal with the ramp wave, measurement circuitry that measures a time period from a generation of the reference signal to a time before the voltage value of the analog signal intersects with the ramp wave of the reference signal, and addition circuitry that derives a convergence voltage value of the analog signal by adding a voltage value corresponding to the measured time period and a voltage value based on the predicted convergence voltage value.

13 Claims, 19 Drawing Sheets

(56) References Cited

U.S. PATENT DOCUMENTS

| | | | |
|---|---|---|---|
| 2011/0025871 A1* | 2/2011 | Yoshioka | H04N 5/35581 |
| | | | 348/222.1 |
| 2011/0205386 A1 | 8/2011 | Koseki et al. | |
| 2020/0029045 A1* | 1/2020 | Enoki | H04N 5/3745 |

* cited by examiner

ANALOG-DIGITAL CONVERTER, ANALOG-DIGITAL CONVERSION METHOD, AND IMAGING DEVICE

TECHNICAL FIELD

The present disclosure relates to an analog-digital converter, an analog-digital conversion method, and an imaging device.

BACKGROUND ART

In recent years, there is an increasing need for high-speed reading for an imaging device. It can be said that to shorten a conversion time by an analog-digital converter that digitizes an analog pixel signal is one of methods for realizing high-speed reading. In the imaging device, a so-called single-slope analog-digital converter is widely used as the analog-digital converter. The single-slope analog-digital converter is an analog-digital converter that digitizes the analog pixel signal by comparing a voltage value of the analog pixel signal with a ramp wave reference signal.

In the single-slope analog-digital converter, in order to shorten an analog-digital conversion time, conventionally, analog-digital conversion is efficiently performed by changing an inclination of the ramp wave reference signal depending on the magnitude of the analog pixel signal (for example, refer to Patent Document 1). According to the conventional technique described in Patent Document 1, by increasing the inclination of the ramp wave reference signal at the time of analog-digital conversion processing coping with long-time exposure, a data reading time is shortened.

Furthermore, a counter circuit that measures a time period from a generation timing of the ramp wave reference signal to a time before the analog pixel signal intersects with the reference signal performs up-counting or down-counting so as to increase the reading speed without changing the inclination of the ramp wave reference signal (for example, refer to Patent Document 2).

CITATION LIST

Patent Document

Patent Document 1: Japanese Patent Application Laid-Open No. 2017-046259
Patent Document 2: Japanese Patent Application Laid-Open No. 2013-236362

SUMMARY OF THE INVENTION

Problems to be Solved by the Invention

By the way, in the imaging device using the single-slope analog-digital converter as the analog-digital converter, when the number and the definition of the pixels increase and analog-digital conversion accuracy increases, a count time of the counter circuit doubles, and the analog-digital conversion time increases. For not only the analog-digital converter mounted on the imaging device but also a general analog-digital converter used for various electronic circuits, it is desired to shorten the analog-digital conversion time.

Therefore, an object of the present disclosure is to provide an analog-digital converter and an analog-digital conversion method that can shorten an analog-digital conversion time and an imaging device including the analog-digital converter.

Solutions to Problems

An analog-digital converter according to the present disclosure to achieve the object, includes:
a voltage acquisition unit that acquires a voltage value of an analog signal in a settling period of the analog signal;
a calculation unit that calculates a predicted convergence voltage value of the analog signal on the basis of the voltage value of the analog signal acquired by the voltage acquisition unit;
a reference signal generation unit that generates a ramp wave reference signal on the basis of the predicted convergence voltage value calculated by the calculation unit;
a comparison unit that compares the voltage value of the analog signal with the ramp wave of the reference signal;
a measurement unit that measures a time period from a generation timing of the reference signal to a time before the voltage value of the analog signal intersects with the ramp wave of the reference signal; and
an addition unit that derives a convergence voltage value of the analog signal by adding a voltage value corresponding to the time period measured by the measurement unit and a voltage value based on the predicted convergence voltage value.

An analog-digital conversion method according to the present disclosure to achieve the object for executing processing including:
a step of acquiring a voltage value of an analog signal in a settling period of the analog signal and calculating a predicted convergence voltage value of the analog signal on the basis of the acquired voltage value of the analog signal;
a step of generating a ramp wave reference signal on the basis of the predicted convergence voltage value of the analog signal;
a step of measuring a time period from a generation timing of the ramp wave reference signal to a time before the voltage value of the analog pixel signal intersects with the ramp wave of the reference signal; and
a step of deriving a convergence voltage value of the analog signal by adding a voltage value corresponding to the measured time period and a voltage value based on the predicted convergence voltage value.

An imaging device according to the present disclosure to achieve the object, includes:
a pixel array unit configured by arranging pixels including photoelectric conversion units in a matrix; and
an analog-digital converter that converts an analog pixel signal output from the pixel into a digital pixel signal, in which
the analog-digital converter includes:
a voltage acquisition unit that acquires a voltage value of an analog signal in a settling period of the analog signal;
a calculation unit that calculates a predicted convergence voltage value of the analog signal on the basis of the voltage value of the analog signal acquired by the voltage acquisition unit;
a reference signal generation unit that generates a ramp wave reference signal on the basis of the predicted convergence voltage value calculated by the calculation unit;
a comparison unit that compares the voltage value of the analog signal with the ramp wave of the reference signal;
a measurement unit that measures a time period from a generation timing of the reference signal to a time before the voltage value of the analog signal intersects with the ramp wave of the reference signal; and
an addition unit that derives a convergence voltage value of the analog signal by adding a voltage value corresponding to the time period measured by the measurement unit and a voltage value based on the predicted convergence voltage value.

MODE FOR CARRYING OUT THE INVENTION

Figure 1:
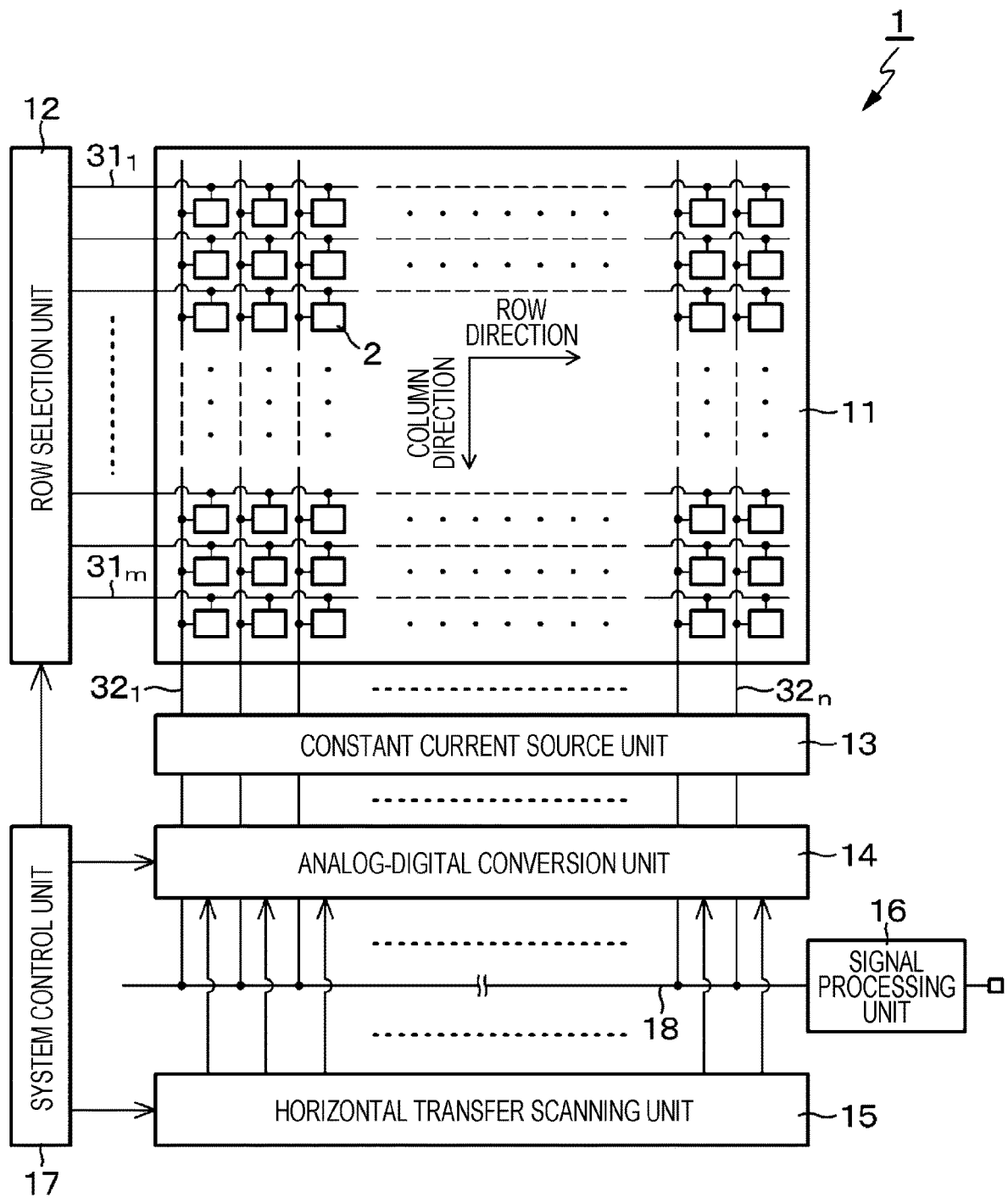
FIG. 1 is a schematic configuration diagram illustrating an exemplary configuration of a basic form of a CMOS image sensor.

Embodiments of the present disclosure will be described in detail below with reference to the drawings. The technology of the present disclosure is not limited to the embodiments, and various values and the like in the embodiments are only exemplary. In the following description, the same elements or elements having the same functions are denoted with the same reference numerals, and overlapped description is omitted. Note that the description will be made in the following order.

1. General Description of Analog-Digital Converter, Analog-Digital Conversion Method, And Imaging Device According to Present Disclosure
2. Basic Form of CMOS Image Sensor
  2-1. Exemplary Configuration of CMOS Image Sensor
  2-2. Exemplary Configuration of Pixel
  2-3. Laminated Chip Structure
3. General Single-Slope Analog-Digital Converter
  3-1. Exemplary Configuration of Single-Slope Analog-Digital Converter
  3-2. About Analog-Digital Conversion Time
4. Embodiments of the Present Disclosure
  4-1. First Embodiment (Example in Which Voltage Values of Analog Pixel Signal Are Acquired Plurality of Times at Equal Intervals)
  4-2. Second Embodiment (Example in Which Voltage Values of Analog Pixel Signal Are Acquired Plurality of Times at Unequal Intervals)
  4-3. Third Embodiment (Example in Which Gain Is Adjusted According to Luminance Information)
  4-4. Fourth Embodiment (First Example of Single-Slope Analog-Digital Converter)
  4-5. Fifth Embodiment (Second Example of Single-Slope Analog-Digital Converter)
  4-6. Sixth Embodiment (Modification of Fourth or Fifth Embodiment: Example of Vertical Reading Method)
5. Modification
6. Application Example
7. Applied Example of Technology According to Present Disclosure
  7-1. Electronic Apparatus According to Present Disclosure (Example of Imaging Device)
  7-2. Application Example to Mobile Body
8. Configuration That Present Disclosure Can Have <General Description of Analog-Digital Converter, Analog-Digital Conversion Method, And Imaging Device According to Present Disclosure>

In an analog-digital converter according to the present disclosure, a reference signal generation unit can have a configuration that maintains a first voltage value during a settling period of an analog signal, changes a voltage value at a first inclination to a voltage value based on a predicted convergence voltage value after the analog signal is converged, and then generates a ramp wave that changes the voltage value at a second inclination smaller than the first inclination. At this time, it is preferable that the voltage value based on the predicted convergence voltage value is a start voltage value at which generation of a ramp wave that changes the voltage value at the second inclination is started.

In the analog-digital converter according to the present disclosure including the preferable configuration, a voltage acquisition unit can have a configuration that compares the voltage value of the analog signal with the ramp wave in the settling period of the analog signal and acquires a voltage value of the analog signal when the ramp wave intersects. Then, a calculation unit can have a configuration that calculates the predicted convergence voltage value of the analog signal by using the voltage value of the analog signal acquired by the voltage acquisition unit and a time period from start of settling of the analog signal to a time before the voltage value of the analog signal intersects with the ramp wave.

Furthermore, in the analog-digital converter according to the present disclosure including the preferable configuration, the calculation unit can have a configuration that calculates the predicted convergence voltage value of the analog signal by using a fixed voltage that has been set in advance and a time period from start of settling of the analog signal to a time before the voltage value of the analog signal intersects with the fixed voltage.

Furthermore, in an analog-digital conversion method of the present disclosure, the voltage values of the analog signal may be acquired at equal or unequal intervals a plurality of times in the settling period of the analog signal. Alternatively, a configuration may be used in which a gain of the analog-digital converter is adjusted according to luminance information.

Furthermore, an imaging device according to the present disclosure can have a configuration in which pixel signal reading directions in an odd-number pixel column and an even-number pixel column are different from each other, and the analog-digital converter is provided every other pixel column for each reading direction. Furthermore, a configuration can be used that has a laminated structure in which at least two semiconductor substrates including a first semiconductor substrate on which a pixel array unit is formed and a second semiconductor substrate on which the analog-digital converter is formed are laminated.

<Basic Form of CMOS Image Sensor>

Hereinafter, as an imaging device to which the technology according to the present disclosure is applied (imaging device according to the present disclosure), a Complementary Metal Oxide Semiconductor (CMOS) image sensor that is a kind of X-T address type imaging devices will be described as an example. The CMOS image sensor is an image sensor that is manufactured by applying a CMOS process or partially using the CMOS process.

[Exemplary Configuration of CMOS Image Sensor]

FIG. 1 is a schematic configuration diagram illustrating an exemplary configuration of a basic form of a CMOS image sensor.

A CMOS image sensor 1 according to the present embodiment has a configuration including a pixel array unit 11 in which pixels 2 each including a photoelectric conversion unit are two-dimensionally arranged in a row direction and a column direction, that is, in a matrix and a peripheral circuit unit of the pixel array unit 11. Here, the row direction indicates an arrangement direction of the pixels 2 in the pixel row (so-called horizontal direction), and the column direction indicates an arrangement direction of the pixels 2 in the pixel column (so-called vertical direction). The pixel 2 generates and accumulates photoelectric charges according to a received light amount by performing photoelectric conversion.

The peripheral circuit unit of the pixel array unit 11 includes, for example, a row selection unit 12, a constant current source unit 13, an analog-digital conversion unit 14, a horizontal transfer scanning unit 15, a signal processing unit 16, a system control unit 17, or the like.

In the pixel array unit 11, pixel driving lines $31_1$ to $31_m$ (may be collectively referred to as "pixel driving line 31" below) are wired for the respective pixel rows along the row direction with respect to the pixel arrangement in a matrix. Furthermore, vertical signal lines $32_1$ to $32_n$ (may be correctively referred to as "vertical signal line 32" below) are wired for the respective pixel columns along the column direction. The pixel driving line 31 transmits a driving signal used to perform driving when a signal is read from the pixel 2. Although the single pixel driving line 31 is illustrated in FIG. 1 as the pixel driving line 31, the number of pixel driving lines 31 is not limited to one. One end of the pixel driving line 31 is connected to an output terminal corresponding to each row of the row selection unit 12.

Hereinafter, each circuit part of the peripheral circuit unit of the pixel array unit 11, that is, the row selection unit 12, the constant current source unit 13, the analog-digital conversion unit 14, the horizontal transfer scanning unit 15, the signal processing unit 16, and the system control unit 17 will be described.

The row selection unit 12 includes a shift register, an address decoder, or the like and controls scanning of a pixel row or an address of the pixel row when selecting each pixel 2 in the pixel array unit 11. A specific configuration of the row selection unit 12 is not illustrated. However, the row selection unit 12 generally includes two scanning systems, i.e., a read scanning system and a sweeping scanning system.

The read scanning system sequentially selects and scans the pixels 2 in the pixel array unit 11 row by row in order to read a pixel signal from the pixel 2. The pixel signal read from the pixel 2 is an analog signal. The sweeping scanning system sweeps and scans a read row, to which the read scanning is performed by the read scanning system, prior to the read scanning by a time of shutter speed.

By performing the sweep scanning by the sweeping scanning system, unnecessary electric charges are swept out from the photoelectric conversion unit of the pixel 2 in the read row. Accordingly, the photoelectric converter is reset. Then, by sweeping out (reset) the unnecessary electric charges by the sweeping scanning system, a so-called electronic shutter operation is performed. Here, the electronic shutter operation is an operation for discarding the photoelectric charge of the photoelectric conversion unit and for newly starting exposure (start to accumulate photoelectric charges).

The constant current source unit 13 includes a plurality of current sources I each including, for example, a MOS transistor connected to each of the vertical signal lines $32_1$ to $32_n$ for each pixel column. The constant current source unit 13 supplies a bias current to each pixel 2 in the pixel row that has been selected and scanned by the row selection unit 12 through each of the vertical signal lines $32_1$ to $32_n$.

The analog-digital conversion unit 14 includes, for example, a set of a plurality of analog-digital converters that is provided in correspondence with the pixel column of the pixel array unit 11 and provided for each pixel column. The analog-digital conversion unit 14 is a column-parallel-type analog-digital conversion unit that converts an analog pixel signal output through each of the vertical signal lines $32_1$ to $32_n$ for each pixel column into a digital signal.

As an analog-digital converter in the column parallel analog-digital conversion unit 14, for example, a single-slope analog-digital converter that is an example of a reference signal comparison type analog-digital converter can be used. Details of the single-slope analog-digital converter will be described later.

The horizontal transfer scanning unit 15 includes a shift register, an address decoder, or the like and controls scanning of the pixel column and the address of the pixel column when reading the signal of each pixel 2 of the pixel array unit 11. Under the control by the horizontal transfer scanning unit 15, the pixel signal that has been converted into the digital signal by the analog-digital conversion unit 14 is read to a horizontal transfer line 18 in pixel column units.

The signal processing unit 16 executes predetermined signal processing on the digital pixel signal supplied through the horizontal transfer line 18 and generates two-dimensional image data. For example, the signal processing unit 16 performs correction of a vertical line or a point, or clamps a signal, or executes digital processing such as parallel-serial conversion, compression, encoding, addition, averaging, or an intermittent operation. The signal processing unit 16 outputs the generated image data to a subsequent device as an output signal of the CMOS image sensor 1.

The system control unit 17 generates various timing signals, clock signals, control signals, or the like and drives and controls the row selection unit 12, the constant current source unit 13, the analog-digital conversion unit 14, the horizontal transfer scanning unit 15, the signal processing unit 16, or the like on the basis of these generated signals.

[Exemplary Circuit Configuration of Pixel]

Figure 2:
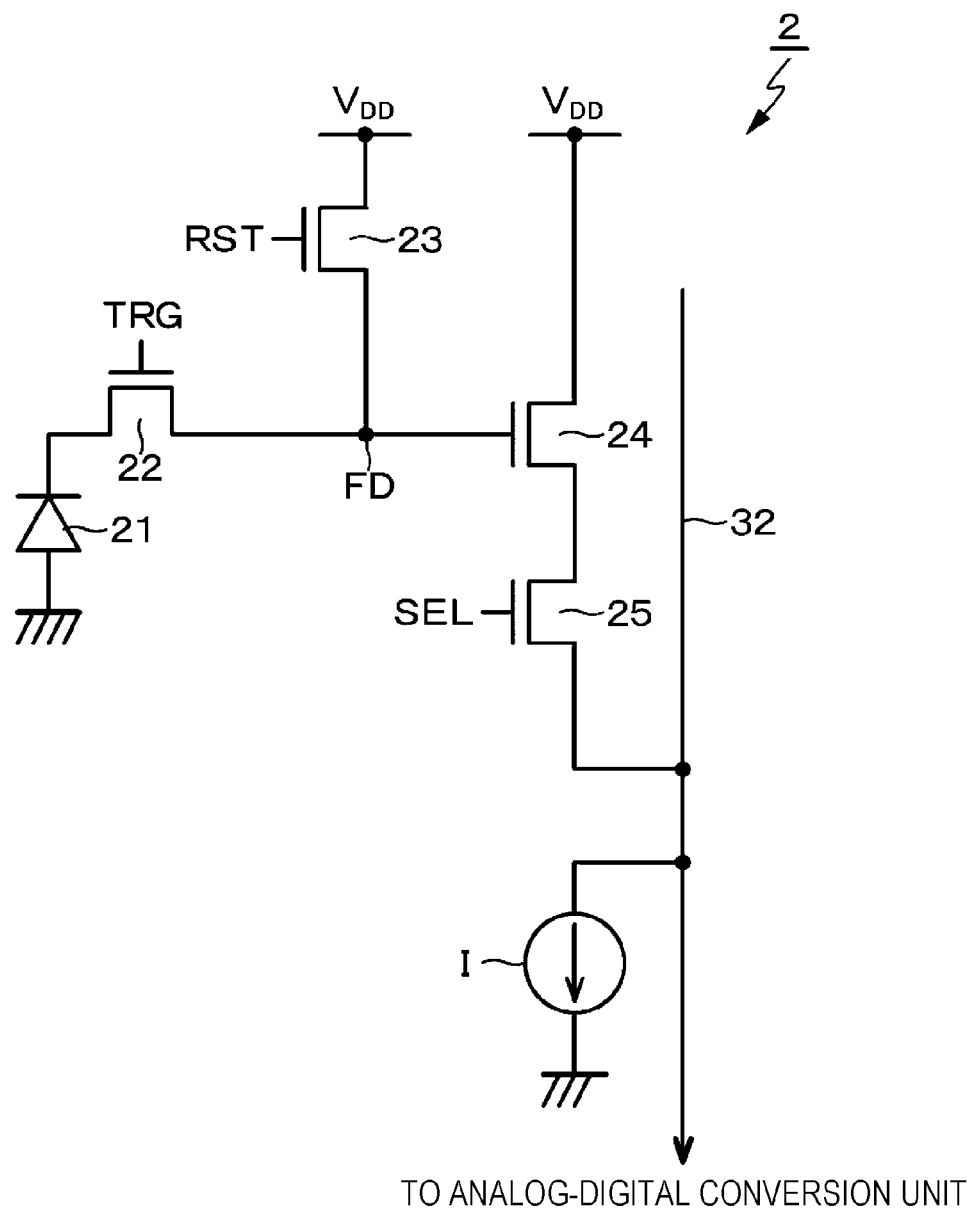
FIG. 2 is a circuit diagram illustrating an example of a circuit configuration of a pixel.

FIG. 2 is a circuit diagram illustrating an exemplary circuit configuration of the pixel 2. The pixel 2 includes, for example, a photodiode 21 as a photoelectric conversion unit (photoelectric conversion element). In addition to the photodiode 21, the pixel 2 has a pixel configuration that includes a transfer transistor 22, a reset transistor 23, an amplifier transistor 24, and a selection transistor 25.

As four transistors including the transfer transistor 22, the reset transistor 23, the amplifier transistor 24, and the selection transistor 25, for example, N-channel MOS Field effect transistors (FET) are used. However, a combination of conductivity types of the four transistors 22 to 25 exemplified here is merely an example, and the combination thereof is not limited to this.

As the pixel driving line 31 described above for the pixel 2, a plurality of lines is wired in common to each pixel 2 in the same pixel row. The plurality of lines (pixel driving line 31) is connected to an output terminal corresponding to each pixel row of the row selection unit 12 in pixel row unit. The row selection unit 12 appropriately outputs a transfer signal TRG, a reset signal RST, and a selection signal SEL to the plurality of lines.

An anode electrode of the photodiode 21 is connected to a power supply on the low potential side (for example, ground). The photodiode 21 photoelectrically converts the received light into the photoelectric charges (here, photoelectron) having a charge amount according to the amount of the received light and accumulates the photoelectric charges. A cathode electrode of the photodiode 21 is electrically connected to a gate electrode of the amplifier transistor 24 via the transfer transistor 22. Here, a region to which the gate electrode of the amplifier transistor 24 is electrically connected is a floating diffusion (floating diffusion region/impurity diffusion region) FD. The floating diffusion FD is a charge-to-voltage conversion unit that converts charges into a voltage.

The row selection unit 12 applies the transfer signal TRG which is active at the high level (for example, $V_{DD}$ level) to a gate electrode of the transfer transistor 22. The transfer transistor 22 is conducted in response to the transfer signal TRG so as to transfer the photoelectric charges which are photoelectrically converted by the photodiode 21 and accumulated in the photodiode 21 to the floating diffusion FD.

The reset transistor 23 is connected between a node of a high-potential-side power supply voltage $V_{DD}$ and the floating diffusion FD. The row selection unit 12 applies the reset signal RST which is active at the high level to a gate electrode of the reset transistor 23. The reset transistor 23 is conducted in response to the reset signal RST and resets the floating diffusion FD by discarding the charge in the floating diffusion FD to the node of the voltage $V_{DD}$.

The gate electrode of the amplifier transistor 24 is connected to the floating diffusion FD, and a drain electrode is connected to the node of the high-potential-side power supply voltage $V_{DD}$. The amplifier transistor 24 is an input unit of a source follower that reads a signal obtained by the photoelectric conversion by the photodiode 21. That is, a source electrode of the amplifier transistor 24 is connected to the vertical signal line 32 via the selection transistor 25. Then, the amplifier transistor 24 and a current source I connected to one end of the vertical signal line 32 are included in the source follower that converts a voltage of the floating diffusion FD into a potential of the vertical signal line 32.

The drain electrode of the selection transistor 25 is connected to the source electrode of the amplifier transistor 24, and a source electrode is connected to the vertical signal line 32. The selection signal SEL that is active at the high level is applied from the row selection unit 12 to a gate electrode of the selection transistor 25. The selection transistor 25 is conducted in response to the selection signal SEL and transmits a signal output from the amplifier transistor 24 to the vertical signal line 32 by selecting the pixel 2.

From the pixel 2 having the above configuration, for example, a reset level (so-called P phase) and a signal level (so-called D phase) are read in this order. The reset level corresponds to a potential of the floating diffusion FD when the floating diffusion FD of the pixel 2 is reset. The signal level corresponds to the potential obtained by the photoelectric conversion by the photodiode 21, that is, the potential of the floating diffusion FD when the charge accumulated in the photodiode 21 is transferred to the floating diffusion FD.

Note that the selection transistor 25 may have a circuit configuration connected between the node of the high-potential-side power supply voltage $V_{DD}$ and the drain electrode of the amplifier transistor 24. Furthermore, in the present embodiment, as a pixel circuit of the pixel 2, a 4Tr structure, that is, a structure including four transistors (Tr), i.e., the transfer transistor 22, the reset transistor 23, the amplifier transistor 24, and the selection transistor 25 is exemplified. However, the pixel circuit is not limited to this. For example, a 3Tr configuration can be used in which the selection transistor 25 is omitted and the amplifier transistor 24 has the function of the selection transistor 25, and a configuration including five or more transistors can be used in which the number of transistors is increased as necessary.

[Laminated Chip Structure]

In the CMOS image sensor 1 having the configuration described above, a chip structure (semiconductor integrated circuit) can be a so-called laminated chip structure. Furthermore, the structure of the pixel 2 can be a back-illuminated pixel structure in which, when a substrate surface on which a wiring layer is formed is set as a surface (front surface), light is irradiated from a rear surface side opposite to the surface or can be a surface-illuminated pixel structure in which light is irradiated from the side of the surface.

Figure 3:
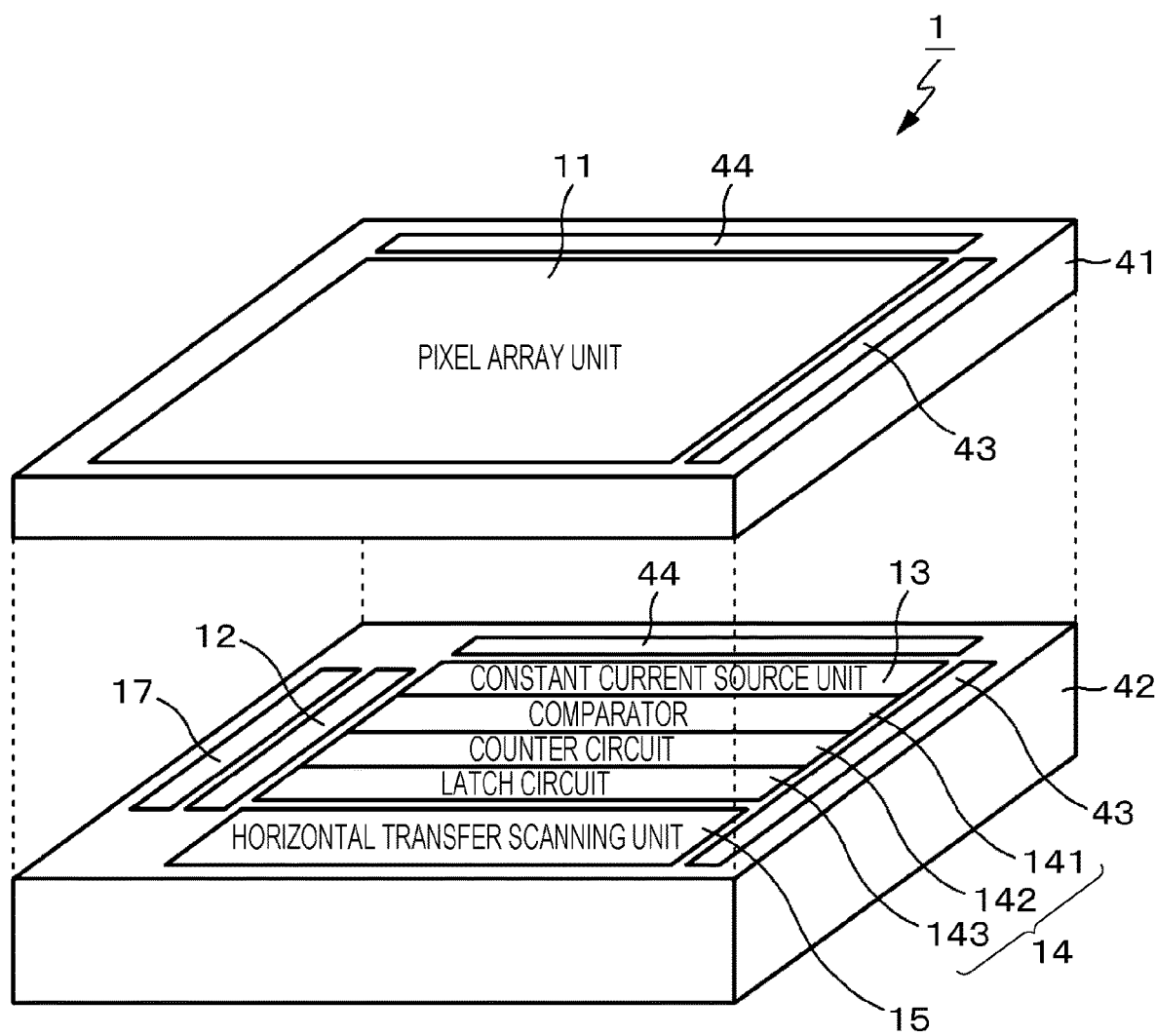
FIG. 3 is an exploded perspective view illustrating an outline of a laminated chip structure in the CMOS image sensor.

FIG. 3 is an exploded perspective view illustrating an outline of a laminated chip structure of the CMOS image sensor 1. As illustrated in FIG. 3, the laminated chip structure has a structure in which at least two semiconductor substrates including a first semiconductor substrate 41 and a second semiconductor substrate 42 are laminated. In this laminated structure, on the first semiconductor substrate 41 that is a first layer, each pixel 2 of the pixel array unit 11, the pixel driving lines $31_1$ to $31_m$, and the vertical signal lines $32_1$ and $32_n$ are formed. Furthermore, on the second semiconductor substrate 42 that is a second layer, the peripheral circuit units such as the row selection unit 12, the constant current source unit 13, the analog-digital conversion unit 14, the horizontal transfer scanning unit 15, the signal processing unit 16, the system control unit 17, a reference signal generation unit 19, or the like are formed. Then, the first semiconductor substrate 41 that is the first layer and the second semiconductor substrate 42 that is the second layer are electrically connected by a connecting portions 43 and 44 such as a Through Chip Via (TCV) or Cu—Cu hybrid bonding.

According to the CMOS image sensor 1 having this laminated structure, it is only necessary for the first semiconductor substrate 41 that is the first layer to have a size (area) where the pixel array unit 11 can be formed. Therefore, the size (area) of the first semiconductor substrate 41, and in addition, a size of an entire chip can be reduced. Moreover, a process suitable for manufacturing the pixel 2 can be applied to the first semiconductor substrate 41 that is the first layer, and a process suitable for manufacturing a pixel control unit can be applied to the second semiconductor substrate 42 that is the second layer. Therefore, there is an advantage such that the process can be optimized when manufacturing the CMOS image sensor 1. In particular, when the pixel control unit is manufactured, it is possible to apply an advanced process.

Note that, here, a two-layer laminated structure is described in which the first semiconductor substrate 41 and the second semiconductor substrate 42 are laminated. However, the laminated structure is not limited to the two-layer structure and can be a structure having three or more layers. Then, in a case of the laminated structure having three or more layers, the row selection unit 12, the constant current source unit 13, the analog-digital conversion unit 14, the horizontal transfer scanning unit 15, the signal processing unit 16, the system control unit 17, the reference signal generation unit 19, or the like can be separately formed on a semiconductor substrate of second and subsequent layers.

Here, as the chip structure of the CMOS image sensor 1, the laminated chip structure is described. However, the chip structure is not limited to the laminated chip structure and can be a so-called flat chip structure. Here, the flat chip structure is a structure in which the peripheral circuit units of the pixel array unit 11 are formed on the same semiconductor substrate on which the pixel array unit 11 is formed.

<General Single-Slope Analog-Digital Converter>

Here, an exemplary configuration of a general single-slope analog-digital converter used as an analog-digital converter in the column parallel analog-digital conversion unit 14 will be described.

[Exemplary Configuration of Single-Slope Analog-Digital Converter]

Figure 4:
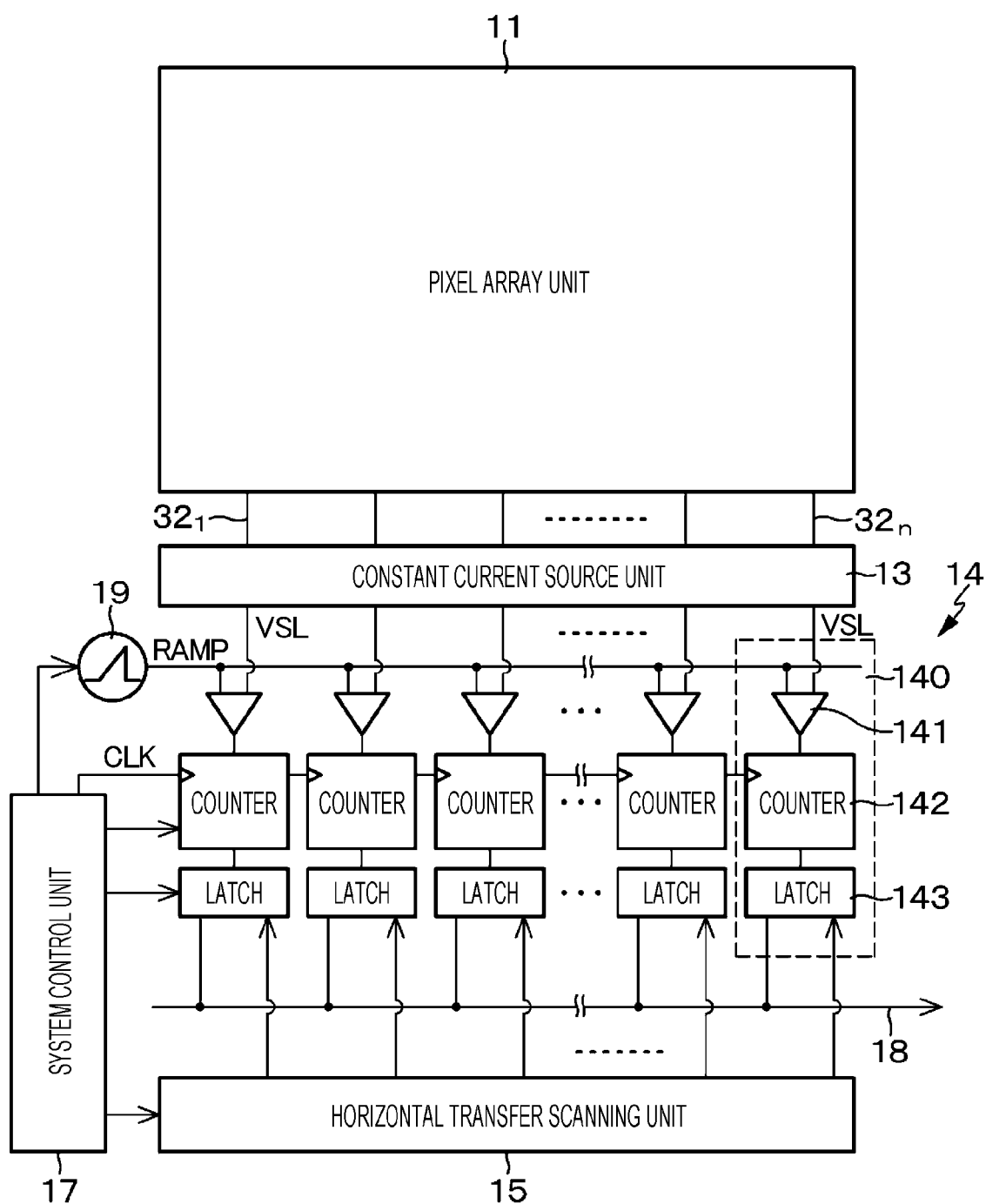
FIG. 4 is a block diagram illustrating an exemplary configuration of a column parallel analog-digital conversion unit including a general single-slope analog-digital converter.

FIG. 4 is a block diagram illustrating an exemplary configuration of the column parallel analog-digital conversion unit 14 including a general single-slope analog-digital converter.

The analog-digital conversion unit 14 includes a set of a plurality of single-slope analog-digital converters 140 provided in correspondence with each of the vertical signal lines $32_1$ to $32_n$. Here, an outline of a configuration of an n-th single-slope analog-digital converter 140 will be described as an example.

The single-slope analog-digital converter 140 has a circuit configuration that includes a comparator 141, a counter circuit 142, and a latch circuit 143. In the single-slope analog-digital converter 140, a so-called ramp wave reference signal RAMP of which a voltage value linearly changes with time is used. The ramp wave reference signal RAMP is generated by the reference signal generation unit 19. The reference signal generation unit 19 can include, for example, a digital-analog conversion (DAC) circuit.

The comparator 141 uses the analog pixel signal VSL read from the pixel 2 as a comparison input and the ramp wave reference signal RAMP generated by the reference signal generation unit 19 as a reference input and compares both signals. Then, for example, an output of the comparator 141 is in a first state (for example, high level) when the reference signal RAMP is larger than the pixel signal VSL and in a second state (for example, low level) when the reference signal RAMP is equal to or less than the pixel signal VSL. With this operation, the comparator 141 outputs a pulse signal having a pulse width according to a signal level of the pixel signal VSL, specifically, corresponding to a magnitude of the signal level as a comparison result.

The counter circuit 142 is an example of a measurement unit that measures a time period from a generation timing of the reference signal RAMP to a time before the voltage value of the analog pixel signal VSL intersects with the ramp wave of the reference signal RAMP. The system control unit 17 applies the clock signal CLK to the counter circuit 142 at a timing same as a supply start timing of the reference signal RAMP to the comparator 141. Then, by performing a counting operation in synchronization with the clock signal CLK, the counter circuit 142 measures a period of a pulse width of an output pulse of the comparator 141, that is, a period from start of a comparison operation to end of the comparison operation. A count result (count value) of the counter circuit 142 is a digital value that is obtained by digitizing the analog pixel signal.

The latch circuit 143 holds (latch) the digital value that is the count result of the counter circuit 142. Furthermore, the latch circuit 143 performs Correlated Double Sampling (CDS) that is an example of noise removal processing by calculating a difference between a D-phase count value corresponding to the pixel signal at the signal level and a P-phase count value corresponding to the pixel signal at the reset level. Then, under the drive by the horizontal transfer scanning unit 15, the latched digital value is output to the horizontal transfer line 18.

As described above, the column parallel analog-digital conversion unit 14 including the set of the single-slope analog-digital converters 140 obtains the digital value from time information before a magnitude relationship between the reference signal RAMP, of which an analog value linearly changes, that is generated by the reference signal generation unit 19 and the analog pixel signal VSL output from the pixel 2 changes.

Note that, in the above example, the analog-digital conversion unit 14 has a configuration in which the analog-digital converters 140 are arranged in a one-to-one relationship with the pixel columns. However, the configuration is not limited to this, and the analog-digital conversion unit 14 can have a configuration in which the analog-digital converter 140 is arranged in units of a plurality of pixel columns. This is similarly applied to the following embodiments.

[About Analog-Digital Conversion Time]

Regarding the CMOS image sensor 1 using the single-slope analog-digital converter 140 having the above configuration, it is desired for the analog-digital converter 140 to perform reading at high definition and at high speed. In the single-slope analog-digital converter 140, after settling of the analog pixel signal VSL is completed, the counter circuit 142 counts both edges (rising/falling) of the clock signal CLK from zero, and an inclination of the reference signal RAMP is changed so as to realize high-speed reading. Furthermore, by performing up-counting or down-counting according to light and dark, it is possible to realize high-speed reading without changing the inclination of the reference signal RAMP.

Figure 5:
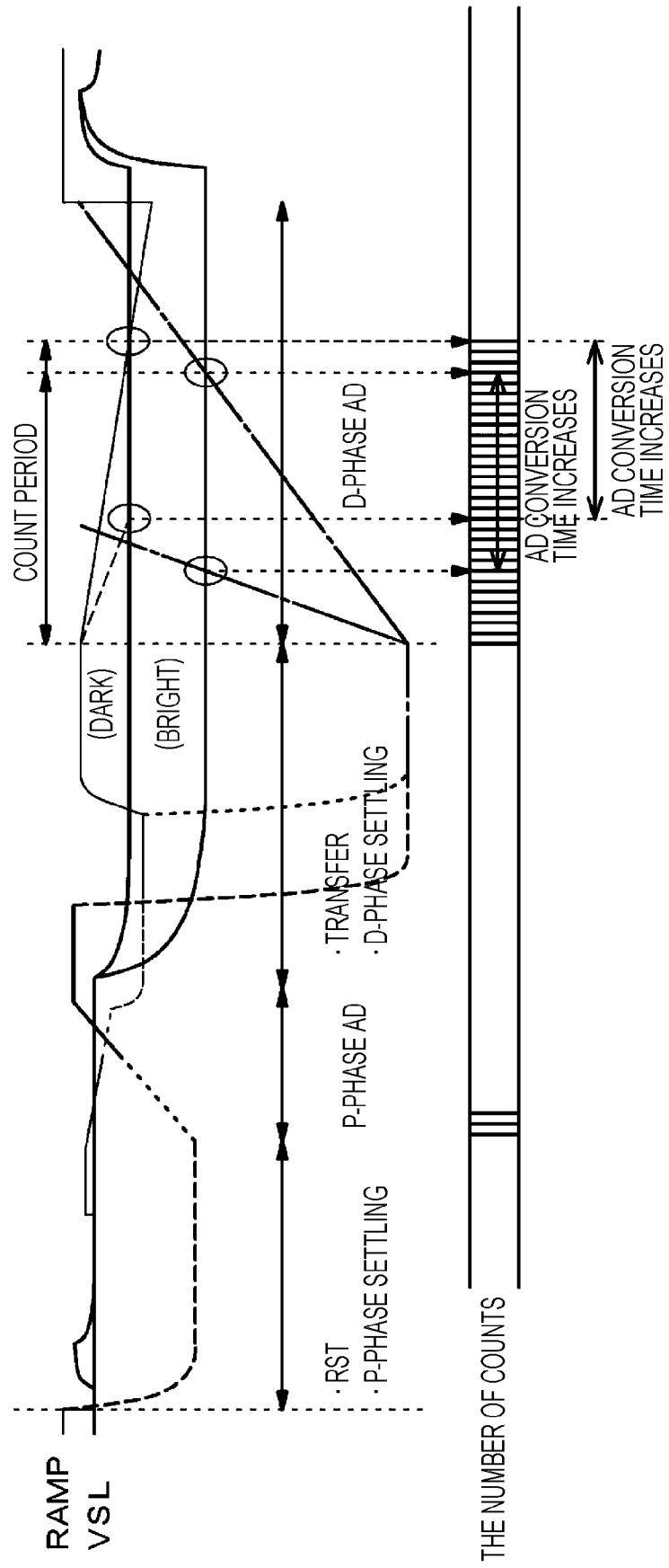
FIG. 5 is a timing waveform diagram for explaining that the number of times of analog-digital conversion increases when a resolution of the single-slope analog-digital converter increases.

In order to realize high definition, it is necessary to increase a resolution of the analog-digital converter 140. However, when the resolution of the single-slope analog-digital converter 140 is increased, the number of counts of the counter circuit 142 inevitably increases. As a result, as illustrated in FIG. 5, an analog-digital conversion time (hereinafter, may be referred to as "AD conversion time") is increased. Specifically, in a case where the counter circuit 142 performs the counting operation at both edges of the clock signal CLK, when it is assumed that a frequency of a single clock is assumed to be 500 MHz, a count period of 1.024 µsec is required in a case of 10-bit analog-digital conversion, and a count period of 16.38 µsec is required in a case of 14-bit analog-digital conversion. Then, when the AD conversion time increases, it is difficult to perform high-speed reading.

EMBODIMENTS OF THE PRESENT DISCLOSURE

Therefore, in the embodiments of the present disclosure, regarding the single-slope analog-digital converter, the AD conversion time is shortened, and the reading speed can be increased. Specifically, in the present embodiment, in the settling period of the analog pixel signal VSL, the voltage value of the analog pixel signal VSL is acquired, and a predicted convergence voltage value of the analog pixel signal VSL is calculated on the basis of the acquired voltage value. Moreover, the ramp wave reference signal RAMP is generated on the basis of the calculated predicted convergence voltage value. More specifically, a start voltage value to start generation of the ramp wave of the reference signal RAMP is set on the basis of the predicted convergence voltage value, and the generation of the ramp wave starts from the set start voltage value.

Then, a time period from the generation timing of the ramp wave of the reference signal RAMP to a time when the voltage value of the analog pixel signal VSL intersects with the ramp wave of the reference signal RAMP is measured, and a voltage value corresponding to the measured time period and the start voltage value on the basis of the predicted convergence voltage value are added to obtain a convergence voltage value of the analog pixel signal VSL. The convergence voltage value is a digital value obtained by digitizing the analog pixel signal VSL.

In this way, the convergence voltage value of the analog pixel signal VSL is predicted in the settling period of the analog pixel signal VSL, and the generation of the ramp wave reference signal RAMP is started from the start voltage value set on the basis of the predicted convergence voltage value, and at the same time, the counter circuit 142 starts to count. With this operation, the number of counts (count time) can be significantly reduced than a case where counting is started from the voltage value of the reference signal RAMP in the settling period. As a result, the AD conversion time can be shortened without lowering the resolution of the analog-digital converter 140. Therefore, it is possible to increase the reading speed of the analog-digital converter 140.

Hereinafter, specific examples of the present embodiment that shorten the AD conversion time and increase the reading speed in the single-slope analog-digital converter 140 will be described.

First Embodiment

Figure 6:
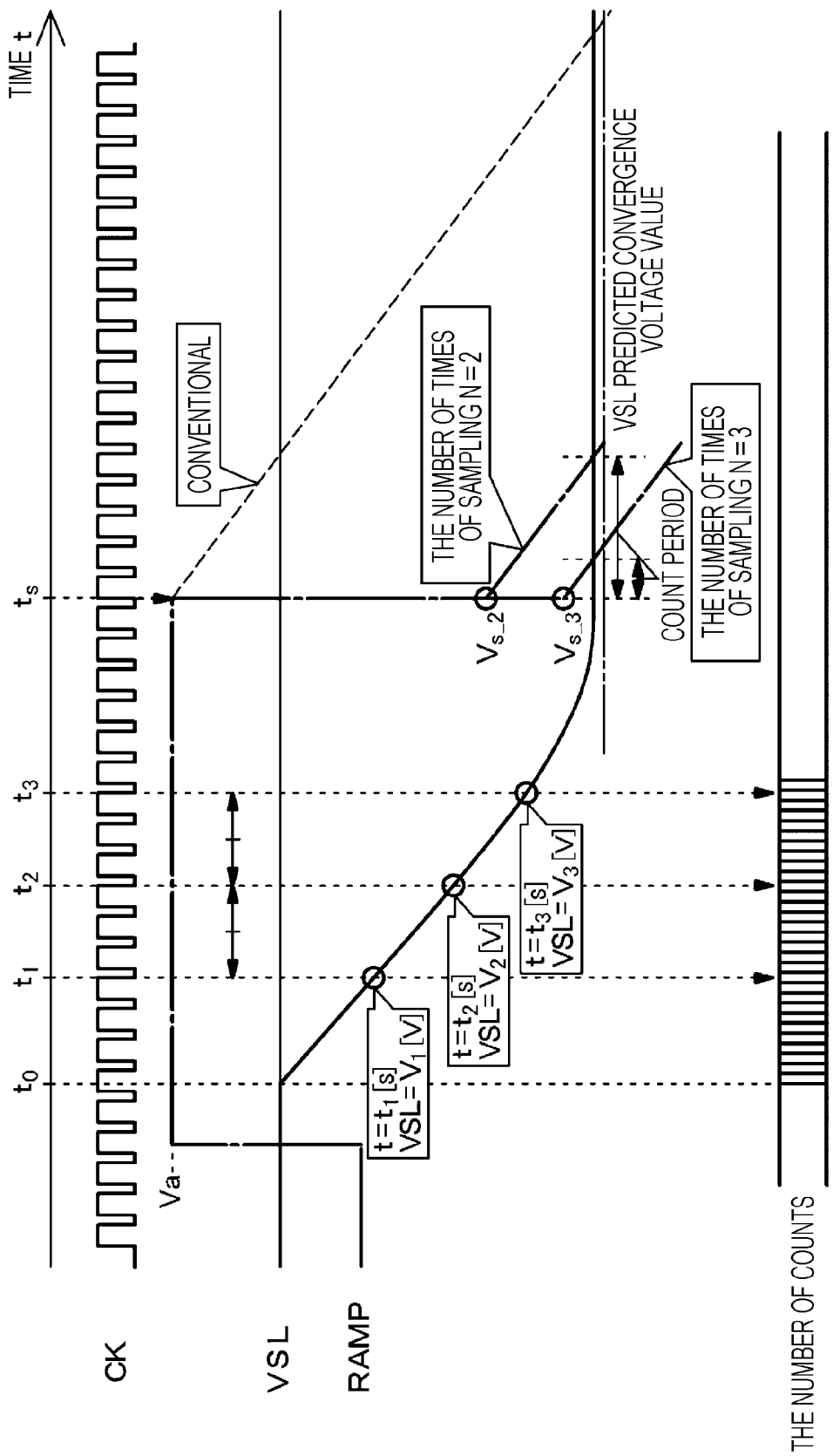
FIG. 6 is a timing waveform diagram for explaining an analog-digital conversion method according to a first embodiment.

A first embodiment is an example of an analog-digital conversion method for acquiring voltage values of an analog pixel signal VSL a plurality of times at equal intervals. A timing waveform diagram for explaining the analog-digital conversion method according to the first embodiment is illustrated in FIG. 6.

In the analog-digital conversion method according to the first embodiment, in a settling period of the analog pixel signal VSL, the voltage value of the analog pixel signal VSL is sampled N times at equal intervals (for example, three clock periods), and the voltage value of the analog pixel signal VSL is acquired N times. In the present embodiment, the number of times of acquisition N of the voltage value of the analog pixel signal VSL is set to N=3, for example. However, the number of times of acquisition N is not limited to three.

Then, in the settling period, voltage values $V_1$, $V_2$, and $V_3$ of the analog pixel signal VSL are sampled at times $t_1$, $t_2$, and $t_3$ at equal intervals, and a predicted convergence voltage value after the settling of the analog pixel signal VSL is terminated is calculated on the basis of the voltage values $V_1$, $V_2$, and $V_3$ of the analog pixel signal VSL acquired in the settling period. The times $t_1$, $t_2$, and $t_3$ are times with reference to a time to when the settling of the analog pixel signal VSL starts.

Here, an example of a method for calculating the predicted convergence voltage value of the analog pixel signal VSL on the basis of the voltage values $V_1$, $V_2$, and $V_3$ of the analog pixel signal VSL acquired in the settling period will be described. A voltage value $V_0(t)$ of the analog pixel signal VSL is roughly estimated by the following formula (1).

$$V_0(t) = V_x(1 - e^{-\frac{1}{CR}t}) \tag{1}$$

In the formula (1), a reference $V_x$ indicates the convergence voltage value of the analog pixel signal VSL, a reference C indicates a wiring capacitance value of a vertical signal line 32, and a reference R indicates a wiring resistance value of a vertical signal line 32. When a time t in the formula (1) is infinite, approximation can be made as $V_0(t)=V_x$. Therefore, by sampling the voltage value of the analog pixel signal VSL in the settling period and obtaining the time t and the voltage value $V_0(t)$, the convergence voltage value $V_x$ of the analog pixel signal VSL can be calculated from the following formula (2) as the predicted convergence voltage value. The time t is a measurement time from the settling start time to of the analog pixel signal VSL to each of the times $t_1$, $t_2$, and $t_3$ when each of the voltage values $V_1$, $V_2$, and $V_3$ is acquired.

$$V_x = V_0(t) \Big/ (1 - e^{-\frac{1}{CR}t}) \qquad (2)$$

When the voltage value $V_0(t)$ of the analog pixel signal VSL is acquired three times in the settling period of the analog pixel signal VSL, three predicted convergence voltage values $V_x$ are calculated on the basis of the voltage values $V_1$, $V_2$, and $V_3$ and each of the measurement times between to and $t_1$, to and $t_2$, and to and $t_3$. Then, an average value of the three predicted convergence voltage values $V_x$ based on the voltage values $V_1$, $V_2$, and $V_3$ is calculated as a final predicted convergence voltage value (in a case where voltage value is acquired twice, average value of predicted convergence voltage values $V_x$ based on two voltage values $V_1$ and $V_2$). Therefore, accuracy for calculating the predicted convergence voltage value can be controlled on the basis of the number of times of acquisition N of the voltage value of the analog pixel signal VSL. Specifically, as the number of times of acquisition N of the voltage value of the analog pixel signal VSL in the settling period increases, the accuracy for calculating the predicted convergence voltage value can be increased.

When the predicted convergence voltage value of the analog pixel signal VSL is calculated, a start voltage value $V_s$ of the ramp wave reference signal RAMP is set to the vicinity of the calculated predicted convergence voltage value at a time $t_s$ when the settling period is terminated. Here, the vicinity of the predicted convergence voltage value indicates a voltage value on the side of a voltage value (first voltage value Va) of the reference signal RAMP in the settling period than the calculated predicted convergence voltage value by a predetermined voltage (constant). In a case of the example in FIG. 6, a voltage value higher than the predicted convergence voltage value by a predetermined voltage value is set as a start voltage value $V_s$ ($V_{s\_2}$/$V_{s\_3}$) of the ramp wave.

In FIG. 6, the start voltage value $V_{s\_2}$ is a start voltage value of a ramp wave that is set on the basis of the predicted convergence voltage value calculated on the basis of the voltage values $V_1$ and $V_2$ of the analog pixel signal VSL acquired twice. Furthermore, the voltage value $V_{s\_3}$ is a start voltage value of a ramp wave that is set on the basis of the predicted convergence voltage value calculated on the basis of the voltage values $V_1$, $V_2$, and $V_3$ of the analog pixel signal VSL acquired three times.

In this way, at the time $t_s$ when the settling of the analog pixel signal VSL is completed, the generation of the ramp wave of the reference signal RAMP is started from the start voltage value $V_s$ ($V_{s\_2}$/$V_{s\_3}$) that is set on the basis of the predicted convergence voltage value. As a result, as indicated by an alternate long and short dash line in FIG. 6, the reference signal RAMP is generated as a ramp wave that maintains the first voltage value Va in the settling period, changes the voltage value with a first inclination to the start voltage value $V_s$ ($V_{s\_2}$/$V_{s\_3}$) in the vicinity of the predicted convergence voltage value after the analog pixel signal VSL is converged, and changes the voltage value with a second inclination smaller than the first inclination thereafter.

In the analog-digital converter 140, the counter circuit 142 starts the counting operation from the time $t_s$ when the settling period of the analog pixel signal VSL is terminated. Then, the counter circuit 142 measures a time period before the ramp wave of the reference signal RAMP of which the generation is started from the start voltage value $V_s$ ($V_{s\_2}$/$V_{s\_3}$) that has been set at the time $t_s$ intersects with the voltage value of the analog pixel signal VSL.

In a conventional analog-digital conversion method, as indicated by a broken line in FIG. 6, the reference signal RAMP is generated as a ramp wave from the first voltage value Va in the settling period at the time is when the settling period of the analog pixel signal VSL is terminated. Then, the counter circuit 142 measures a time period from the time $t_s$ when the settling period of the analog pixel signal VSL is terminated to a time before the ramp wave indicated by the broken line intersects with the voltage value of the analog pixel signal VSL. That is, the counter circuit 142 starts the counting operation as setting the first voltage value Va to zero.

On the other hand, in the analog-digital conversion method according to the first embodiment, the counter circuit 142 measures a time period (period) from the time $t_s$ when the settling period of the analog pixel signal VSL is terminated to the time before the ramp wave of which the generation has been started from the start voltage value $V_s$ ($V_{s\_2}$/$V_{s\_3}$) set at the time $t_s$ intersects with the voltage value of the analog pixel signal VSL. That is, the counter circuit 142 sets the start voltage value $V_s$ to zero and measures the time period from the time $t_s$ to the time before the voltage value of the analog pixel signal VSL intersects with the ramp wave.

Therefore, according to the analog-digital conversion method according to the first embodiment, the number of counts (count time) can be significantly reduced than a case of the conventional analog-digital conversion method for starting to generate the ramp wave from the first voltage value Va of the reference signal RAMP in the settling period and starting the counting operation as setting the first voltage value Va to zero. As a result, the AD conversion time can be shortened without lowering the resolution of the analog-digital converter 140. Therefore, it is possible to increase the reading speed of the analog-digital converter 140.

Note that, in a case of the analog-digital conversion method according to the first embodiment, since the generation of the ramp wave is started from the start voltage value $V_s$ ($V_{s\_2}$/$V_{s\_3}$), the measurement time (count value) of the counter circuit 142 is not a convergence voltage value of the analog pixel signal VSL. Therefore, in the analog-digital conversion method according to the first embodiment, a voltage value obtained by adding the voltage value corresponding to the measurement time of the counter circuit 142 (that is, voltage value in count period) and the start voltage value $V_s$ ($V_{s\_2}$/$V_{s\_3}$) is used as the convergence voltage value of the analog pixel signal VSL.

Second Embodiment

Figure 7:
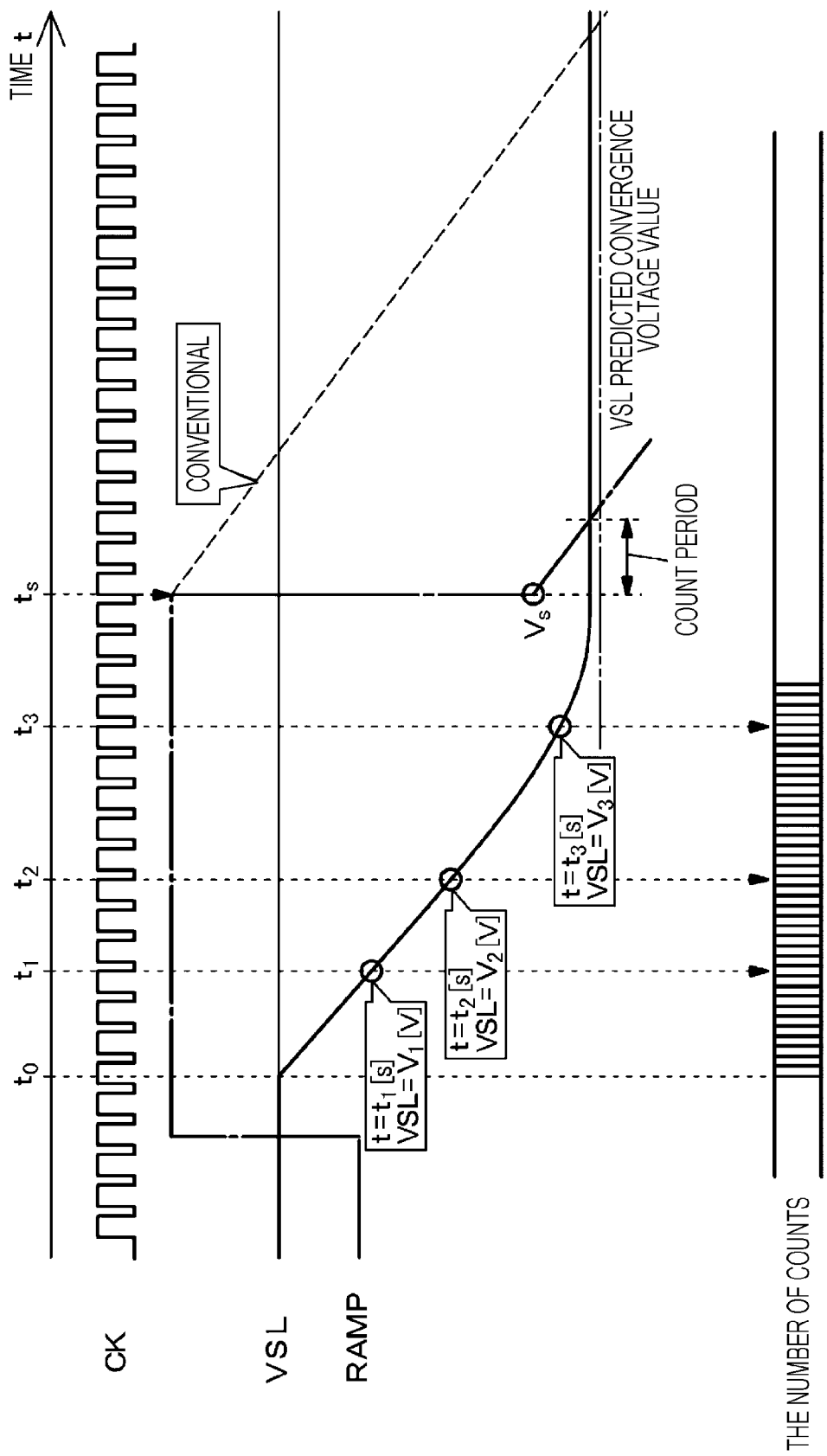
FIG. 7 is a timing waveform diagram for explaining an analog-digital conversion method according to a second embodiment.

A second embodiment is an example of an analog-digital conversion method for acquiring voltage values of an analog pixel signal VSL a plurality of times at unequal intervals. A timing waveform diagram for explaining the analog-digital conversion method according to the second embodiment is illustrated in FIG. 7.

In the analog-digital conversion method according to the second embodiment, in a settling period of the analog pixel signal VSL, the voltage value of the analog pixel signal VSL is sampled N times at unequal intervals, and the voltage value of the analog pixel signal VSL is acquired N times. In the present embodiment, the number of times of acquisition N of the voltage value of the analog pixel signal VSL is set to N=3, for example. However, the number of times of acquisition N is not limited to three.

Then, in the settling period, a voltage value $V_1$ is acquired at a time $t_1$, a voltage value $V_2$ is acquired at a time $t_2$, and a voltage value $V_3$ is acquired at a time $t_3$. Here, as an example, an interval from the time $t_1$ to the time $t_2$ is set as a three-clock period, and an interval from the time $t_2$ to the time $t_3$ is set as a five-clock period. These intervals can be set arbitrarily.

In this way, on the basis of the voltage values $V_1$, $V_2$, and $V_3$ of the analog pixel signal VSL acquired in the settling period, a predicted convergence voltage value after the settling of the analog pixel signal VSL is completed is calculated. The predicted convergence voltage value of the analog pixel signal VSL can be calculated by applying the calculation method according to the first embodiment. Each processing for setting a start voltage value $V_s$ of the ramp wave after the predicted convergence voltage value is calculated, measuring a time period from a time $t_s$ to a time before the voltage value of the analog pixel signal VSL intersects with the ramp wave, and adding the voltage value corresponding to the measurement time and the start voltage value $V_s$ is similar to that in the first embodiment.

In the analog-digital conversion method according to the second embodiment in which the voltage value of the analog pixel signal VSL is acquired at unequal intervals, accuracy for calculating the predicted convergence voltage value of the analog pixel signal VSL can be improved by adjusting a timing for adaptively performing sampling (acquiring) for each signal amount of the analog pixel signal VSL.

Third Embodiment

Figure 8:
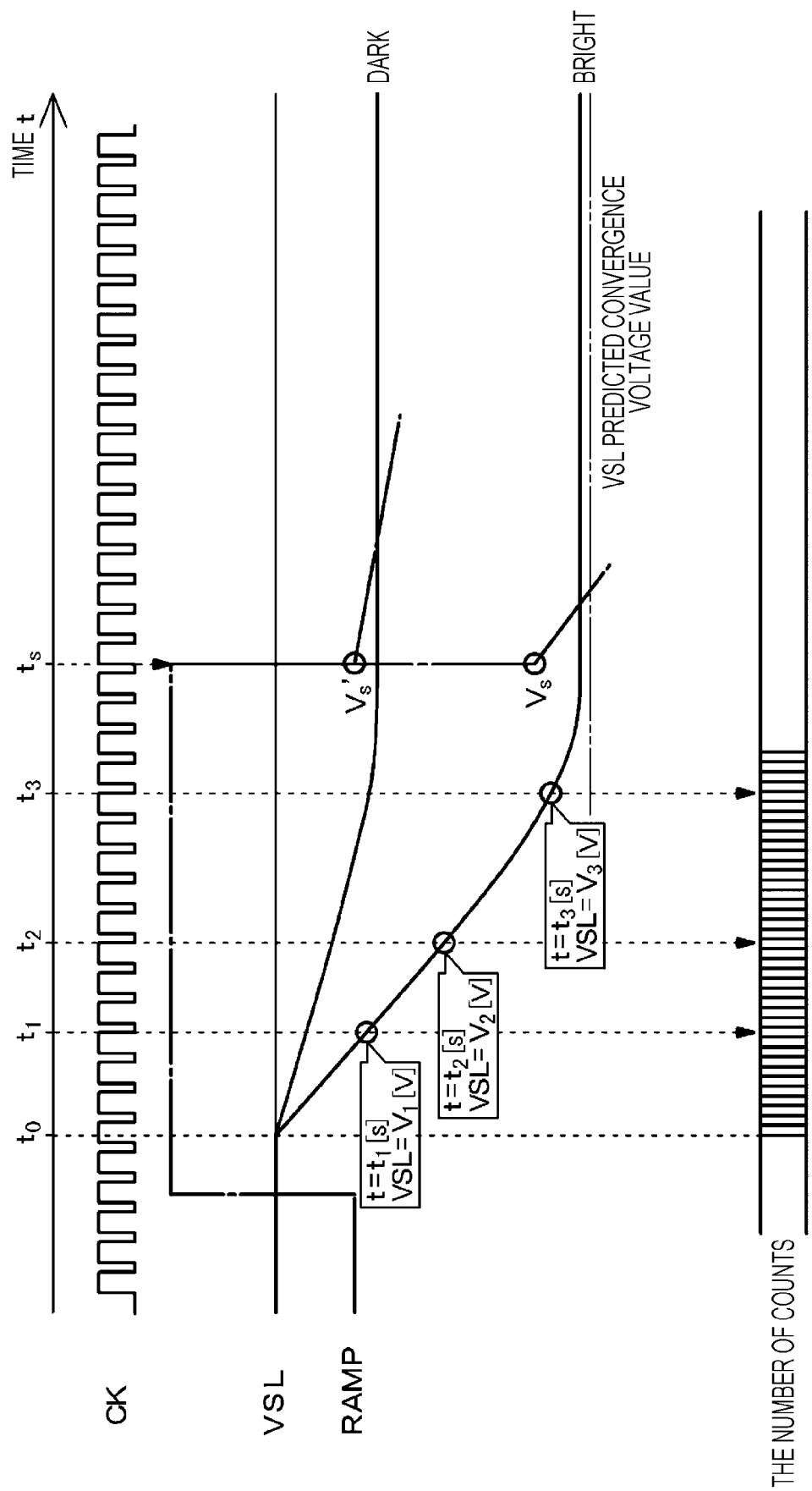
FIG. 8 is a timing waveform diagram for explaining an analog-digital conversion method according to a third embodiment.

A third embodiment is an example of an analog-digital conversion method for adaptively sampling a voltage value of an analog pixel signal VSL and adjusting a gain of an analog-digital converter 140 according to luminance information. A timing waveform diagram for explaining the analog-digital conversion method according to the second embodiment is illustrated in FIG. 8.

In the analog-digital conversion method according to the third embodiment, the gain of the analog-digital converter 140 is adjusted according to the luminance information, specifically, a signal level of the analog pixel signal VSL at a bright time and a signal level of the analog pixel signal VSL at a dark time. The gain of the analog-digital converter 140 can be adjusted by changing an inclination of a ramp wave of a reference signal RAMP.

Processing for sampling and acquiring voltage values $V_1$, $V_2$, and $V_3$ of the analog pixel signal VSL at times $t_1$, $t_2$, and $t_3$ at unequal intervals in a settling period of the analog pixel signal VSL at the bright time or at the dark time is similar to that in a case of the second embodiment. Furthermore, each processing for calculating a predicted convergence voltage value on the basis of the voltage values $V_1$, $V_2$, and $V_3$, setting a start voltage value $V_s$ of the ramp wave, measuring a time period from a time $t_s$ to a time before the voltage value of the analog pixel signal VSL intersects with the ramp wave of the reference signal RAMP, and adding the voltage value corresponding to the measurement time and the start voltage value $V_s$ is similar to that in a case of the first embodiment.

Then, in the analog-digital conversion method according to the third embodiment, an inclination of the ramp wave reference signal RAMP of which generation is started from a start voltage value $V_s'$ at the dark time is set to be smaller than an inclination of the ramp wave reference signal RAMP of which generation is started from the start voltage value $V_s$ at the bright time. Because the gain of the analog-digital converter 140 is determined on the basis of the inclination of the ramp wave reference signal RAMP, it is possible to set the gain at the dark time to be larger than the gain at the bright time by setting the inclination at the dark time to be smaller than the inclination at the bright time.

In this way, a desired low illuminance gradation can be acquired by adaptively changing the inclination of the ramp wave reference signal RAMP according to the luminance information and adjusting the gain of the analog-digital converter 140.

Fourth Embodiment

Figure 9:
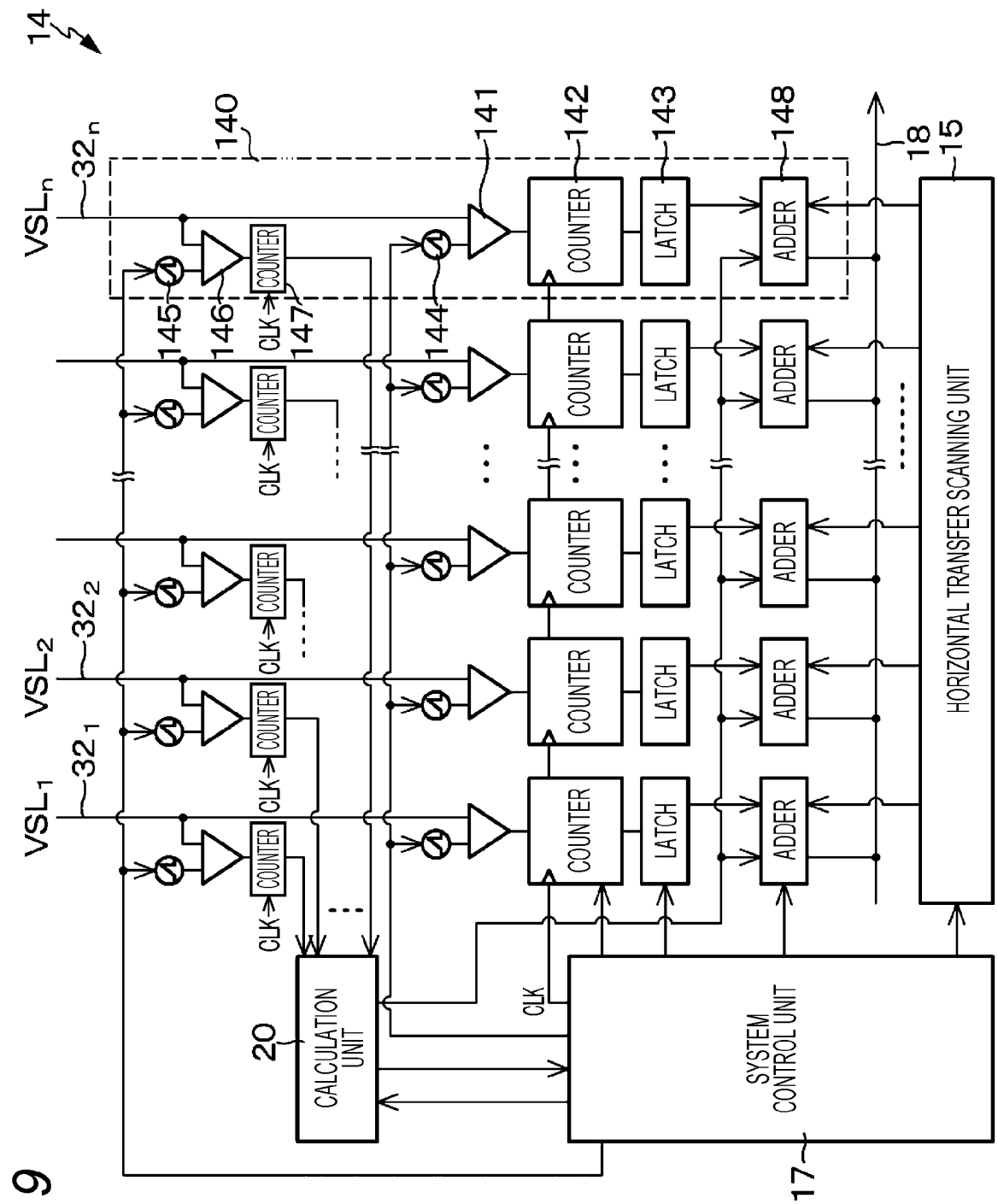
FIG. 9 is a block diagram illustrating an exemplary configuration of a column parallel analog-digital conversion unit including an analog-digital converter according to a fourth embodiment.

A fourth embodiment is a first example of a single-slope analog-digital converter for realizing the analog-digital conversion method according to the first embodiment, the second embodiment, or the third embodiment. An exemplary configuration of a column parallel analog-digital conversion unit including the single-slope analog-digital converter according to the fourth embodiment is illustrated in FIG. 9.

Hereinafter, as the single-slope analog-digital converter according to the fourth embodiment, an outline of a configuration of an analog-digital converter 140 in an n-th column of a column parallel analog-digital conversion unit 14 will be described as an example.

The analog-digital converter 140 according to the fourth embodiment includes a reference signal generation unit 144 for each pixel column. The reference signal generation unit 144 corresponds to the reference signal generation unit 19 that is commonly provided for the analog-digital converter 140 for each pixel column in the column parallel analog-digital conversion unit 14 illustrated in FIG. 4. Then, the reference signal generation unit 144 generates the ramp wave reference signal RAMP for each pixel column under control by a system control unit 17. The reference signal RAMP generated by the reference signal generation unit 144 is, for example, a ramp wave of which generation is started from a start voltage value $V_s$ ($V_{s\_2}/V_{s\_3}$) in the first embodiment (FIG. 6).

The analog-digital converter 140 according to the fourth embodiment includes a reference signal generation unit 145, a comparator 146, and a counter circuit 147 as circuit units in the preceding stage of the comparator 141 for each pixel column. Under the control by the system control unit 17, the reference signal generation unit 145 generates a ramp wave reference signal RAMPa used to acquire a voltage value of an analog pixel signal VSL in a settling period of the analog pixel signal VSL. The comparator 146 compares the ramp wave of the reference signal RAMPa with the analog pixel signal VSL in the settling period of the analog pixel signal VSL, and an output is inverted at a timing when the ramp wave of the reference signal RAMPa intersects with the voltage value of the analog pixel signal VSL.

The counter circuit 147 performs a counting operation in synchronization with a clock signal CLK applied from the system control unit 17 and measures a time period from a settling start timing of the analog pixel signal VSL to a timing when the ramp wave of the reference signal RAMPa intersects with the voltage value and the analog pixel signal VSL and the output of the comparator 146 is inverted. The voltage value corresponding to the measurement time of the counter circuit 147 is the voltage value of the analog pixel signal VSL in the settling period.

As described above, the reference signal generation unit 145, the comparator 146, and the counter circuit 147 configure a voltage acquisition unit that acquires the voltage value of the analog pixel signal VSL in the settling period of the analog pixel signal VSL.

Figure 10:
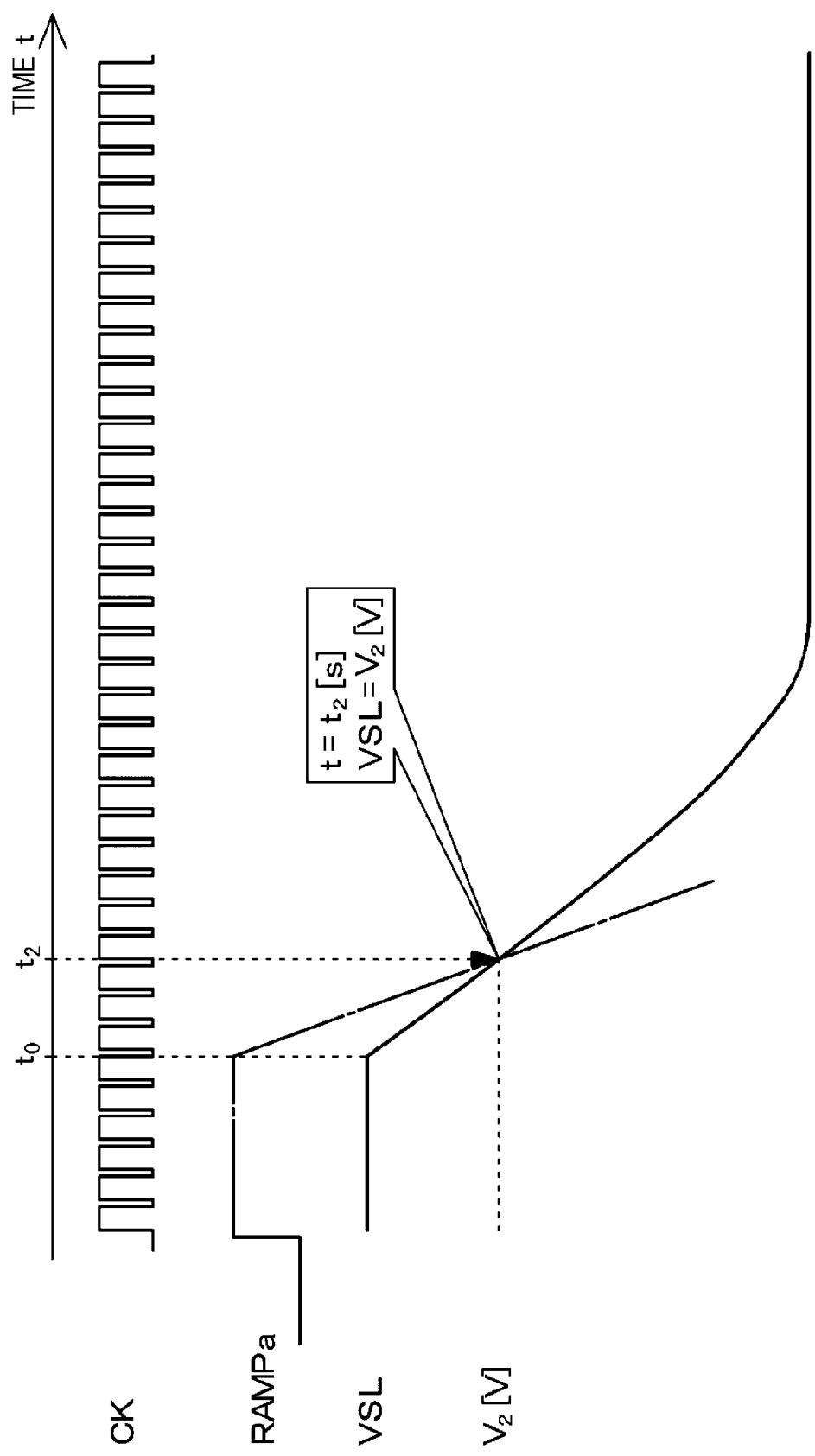
FIG. 10 is a timing waveform diagram illustrating a timing relationship between voltage values of a clock signal CLK, a ramp wave reference signal RAMPa, and an analog pixel signal VSL in the analog-digital converter according to the fourth embodiment.

A timing relationship between the voltage values of the clock signal CLK, the ramp wave reference signal RAMPa, and the analog pixel signal VSL in the analog-digital converter 140 according to the fourth embodiment is illustrated in FIG. 10. FIG. 10 illustrates a case where a voltage value $V_2$ is acquired as the voltage value of the analog pixel signal VSL in the settling period at a timing (time $t_{s\_2}$) when the ramp wave of the reference signal RAMPa intersects with the voltage value of the analog pixel signal VSL.

A calculation unit 20 calculates a predicted convergence voltage value after the settling of the analog pixel signal VSL is terminated on the basis of the voltage value $V_2$ of the analog pixel signal VSL acquired in the settling period and the measurement time of the counter circuit 147. The predicted convergence voltage value of the analog pixel signal VSL can be calculated by applying the calculation method according to the first embodiment. In a case where a plurality of voltage values of the analog pixel signal VSL is acquired in the settling period, the calculation unit 20 calculates an average value of a plurality of predicted convergence voltage values based on the plurality of voltage values and sets the average value as the final predicted convergence voltage value. Then, the calculation unit 20 sets the start voltage value $V_s$ at which the generation of the ramp wave of the reference signal RAMP is started to the vicinity of the calculated predicted convergence voltage value.

Note that, in the example described above, the voltage value of the analog pixel signal VSL is acquired once in the settling period, the predicted convergence voltage value after the settling is terminated is calculated on the basis of the acquired value, and the start voltage value $V_s$ is set to the vicinity of the predicted convergence voltage value. However, the number of times of acquisition of the voltage value of the analog pixel signal VSL is not limited to one. Specifically, by setting the ramp wave of the reference signal RAMPa to a combination of a rising waveform and a falling waveform, it is possible to acquire the voltage values of the analog pixel signal VSL a plurality of times. In this case, because the plurality of predicted convergence voltage values is calculated on the basis of the plurality of acquired voltage values, an average value of the plurality of predicted convergence voltage values is set as a final predicted convergence voltage value.

In response to the setting of the start voltage value $V_s$ by the calculation unit 20, the system control unit 17 controls the reference signal generation unit 144 so as to start to generate the ramp wave of the reference signal RAMP from the start voltage value $V_s$. The comparator 141 compares the ramp wave of the reference signal RAMP of which the generation is started by the reference signal generation unit 144 and the voltage value of the analog pixel signal VSL, and an output is inverted at the timing when the ramp wave intersects with the voltage value of the analog pixel signal VSL.

At the generation start timing of the ramp wave by the reference signal generation unit 144, the system control unit 17 supplies the clock signal CLK to the counter circuit 142 and starts a counting operation of the counter circuit 142. With this operation, a case of the first embodiment will be described as an example. The counter circuit 142 starts the counting operation at the time $t_s$ when the settling period of the analog pixel signal VSL is terminated and performs the counting operation before the timing when the ramp wave of which the generation is started by the reference signal generation unit 144 intersects with the voltage value of the analog pixel signal VSL and the output of the comparator 141 is inverted. That is, the counter circuit 142 measures the time period (period) from the time $t_s$ when the settling period is terminated to the time before the ramp wave of which the generation is started by the reference signal generation unit 144 intersects with the voltage value of the analog pixel signal VSL. The voltage value corresponding to the time period measured by the counter circuit 142 is latched by a latch circuit 143.

The analog-digital converter 140 according to the fourth embodiment includes an adder 148 at the subsequent stage of the latch circuit 143 as an addition unit for each pixel column. The voltage value latched by the latch circuit 143 is a voltage value corresponding to the time period from the time $t_s$ when the settling period is terminated to the time before the ramp wave of which the generation is started from the start voltage value $V_s$ intersects with the voltage value of the analog pixel signal VSL. Then, the adder 148 adds the voltage value latched by the latch circuit 143 (that is, voltage value corresponding to measurement time of counter circuit 142) and the start voltage value $V_s$. Then, the addition result of the adder 148 is set as the convergence voltage value of the analog pixel signal VSL.

Figure 11:
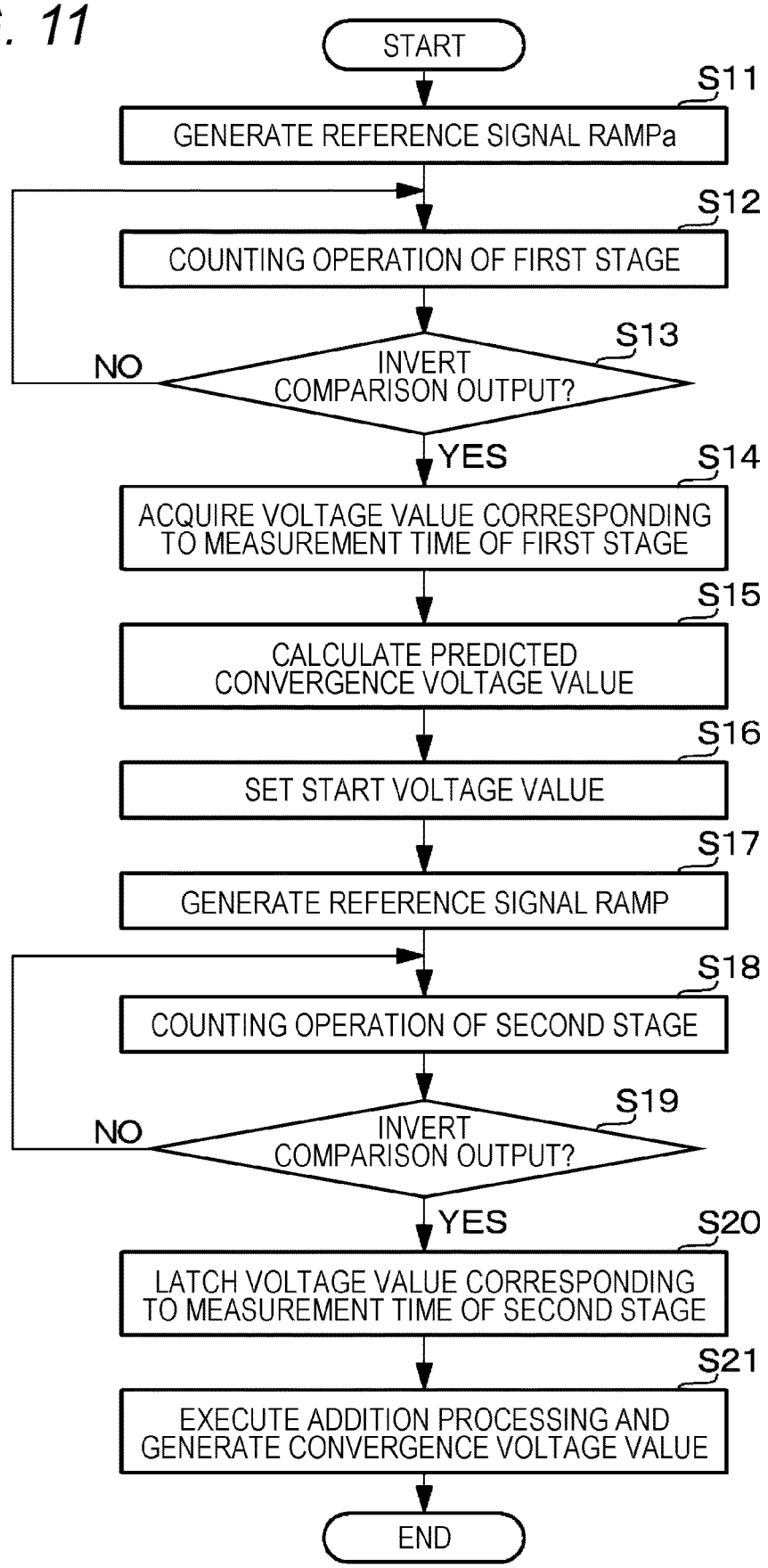
FIG. 11 is a flowchart illustrating a flow of analog-digital conversion processing by the analog-digital converter according to the fourth embodiment.

Subsequently, a flow of analog-digital conversion processing by the analog-digital converter 140 according to the fourth embodiment having the configuration described above will be described with reference to the flowchart in FIG. 11. The series of processing is executed under the control by the system control unit 17.

The system control unit 17 starts to generate the ramp wave reference signal RAMPa used to acquire the voltage value of the analog pixel signal VSL by driving the reference signal generation unit 145 (step S11) and then supplies the clock signal CLK to the counter circuit 147 in the first stage and starts a counting operation of the first stage (step S12).

The counting operation of the counter circuit 147 in the first stage is performed until the ramp wave of the reference signal RAMPa intersects with the voltage value of the analog pixel signal VSL and the output of the comparator 146 is inverted. Then, when the output of the comparator 146 is inverted and the counting operation of the counter circuit 147 in the first stage is stopped (YES in step S13), the system control unit 17 acquires a voltage value of the analog pixel signal VSL corresponding to a measurement time (count value) of the first stage (step S14). In the example illustrated in FIG. 10, the voltage value $V_2$ is acquired at a timing when the output of the comparator 146 is inverted.

Next, the calculation unit 20 calculates a predicted convergence voltage value after the settling of the analog pixel signal VSL is completed on the basis of the voltage value $V_2$ of the analog pixel signal VSL acquired in the settling period and the measurement time of the counter circuit 147 in the first stage (step S15) and then, sets the start voltage value $V_s$ at which the generation of the ramp wave of the reference signal RAMP is started to the vicinity of the calculated predicted convergence voltage value (step S16).

Next, the system control unit 17 starts to generate the ramp wave of the reference signal RAMP from the start voltage value $V_s$ by driving the reference signal generation unit 144 (step S17), and then, supplies the clock signal CLK to the counter circuit 144 in the second stage and starts a counting operation of the second stage (step S18).

The counting operation of the counter circuit 142 in the second stage is performed until the ramp wave of the reference signal RAMP intersects with the voltage value of the analog pixel signal VSL and the output of the comparator 141 is inverted. Then, when the output of the comparator 141 is inverted and the counting operation of the counter circuit 142 in the second stage is stopped (YES in step S19), the system control unit 17 latches a voltage value corresponding to a measurement time (count value) of the second stage to the latch circuit 143 (step S20).

Next, the system control unit 17 drives the adder 148 and adds the voltage value latched by the latch circuit 143 (that is, voltage value corresponding to measurement time of counter circuit 142) and the start voltage value $V_s$ so as to generate the convergence voltage value of the analog pixel signal VSL (step S21).

As described above, according to the analog-digital converter 140 according to the fourth embodiment, the single-slope analog-digital converter can realize the analog-digital conversion method according to the first embodiment, the second embodiment, or the third embodiment that shortens an AD conversion time and increases a reading speed.

Fifth Embodiment

A fifth embodiment is a second example of the single-slope analog-digital converter for realizing the analog-digital conversion method according to the first embodiment, the second embodiment, or the third embodiment.

In the fourth embodiment, a configuration is adopted in which a reference signal RAMPa of a ramp wave is generated, a voltage value $V_2$ is acquired at a timing when the ramp wave intersects with a voltage value of an analog pixel signal VSL, and a predicted convergence voltage value after settling is completed is calculated on the basis of the acquired voltage value $V_2$ and a time period before acquiring the voltage value $V_2$. On the other hand, in the fifth embodiment, a configuration is adopted in which a fixed voltage is set as the voltage value $V_2$ in advance and the predicted convergence voltage value after the settling is completed is calculated on the basis of the set voltage value $V_2$ and a time period before the voltage value $V_2$ intersects with the voltage value of the analog pixel signal VSL.

Figure 12:
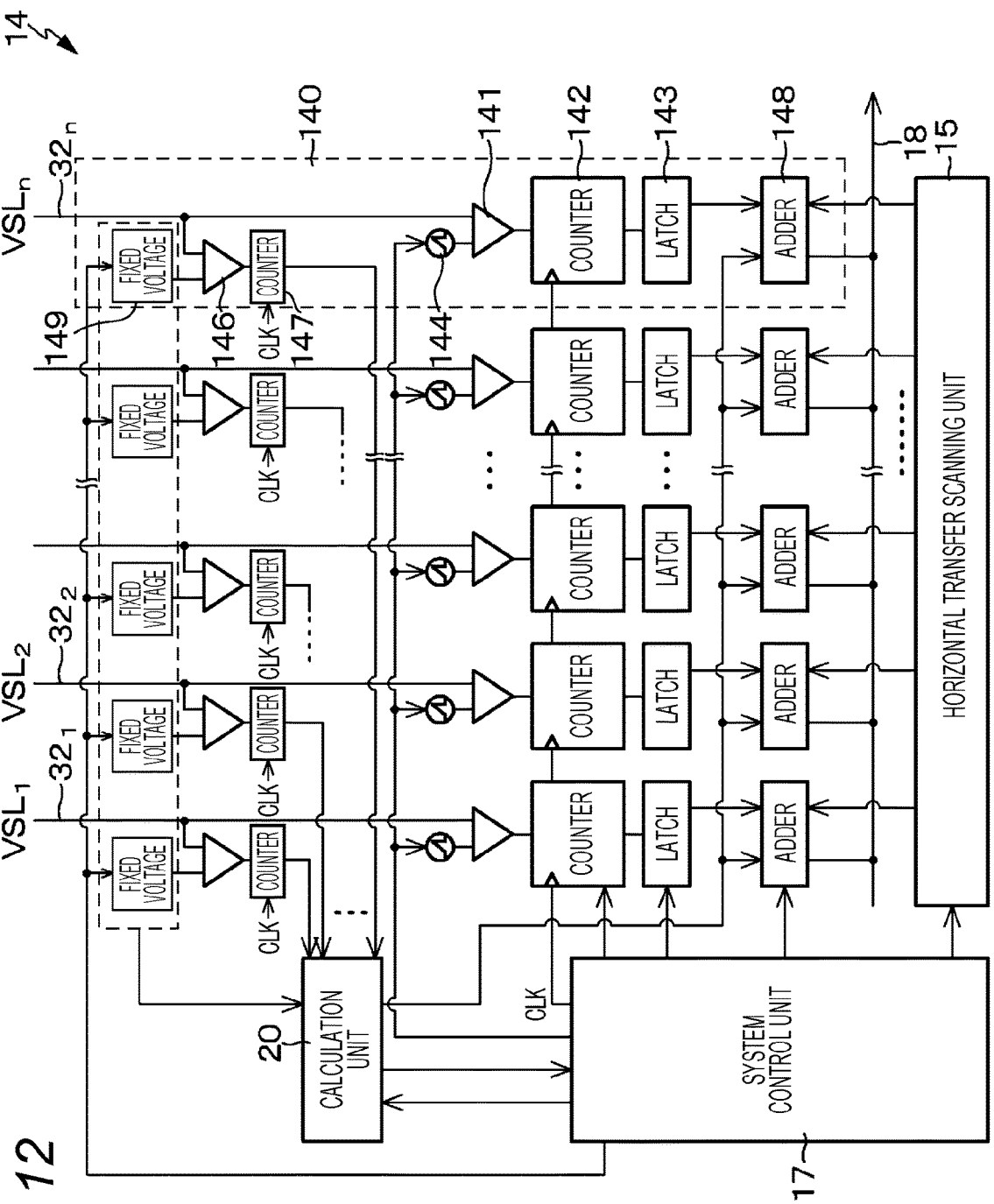
FIG. 12 is a block diagram illustrating an exemplary configuration of a column parallel analog-digital conversion unit including an analog-digital converter according to a fifth embodiment.

An exemplary configuration of a column parallel analog-digital conversion unit including the single-slope analog-digital converter according to the fifth embodiment is illustrated in FIG. 12. The fifth embodiment has a configuration that includes a fixed voltage setting unit 149 instead of the reference signal generation unit 145 in the fourth embodiment. The fixed voltage setting unit 149 sets the fixed voltage as the voltage value of the analog pixel signal VSL in a settling period and applies the fixed voltage to a comparator 146 as a reference input. The fixed voltage set by the fixed voltage setting unit 149 is applied to a calculation unit 20.

Figure 13:
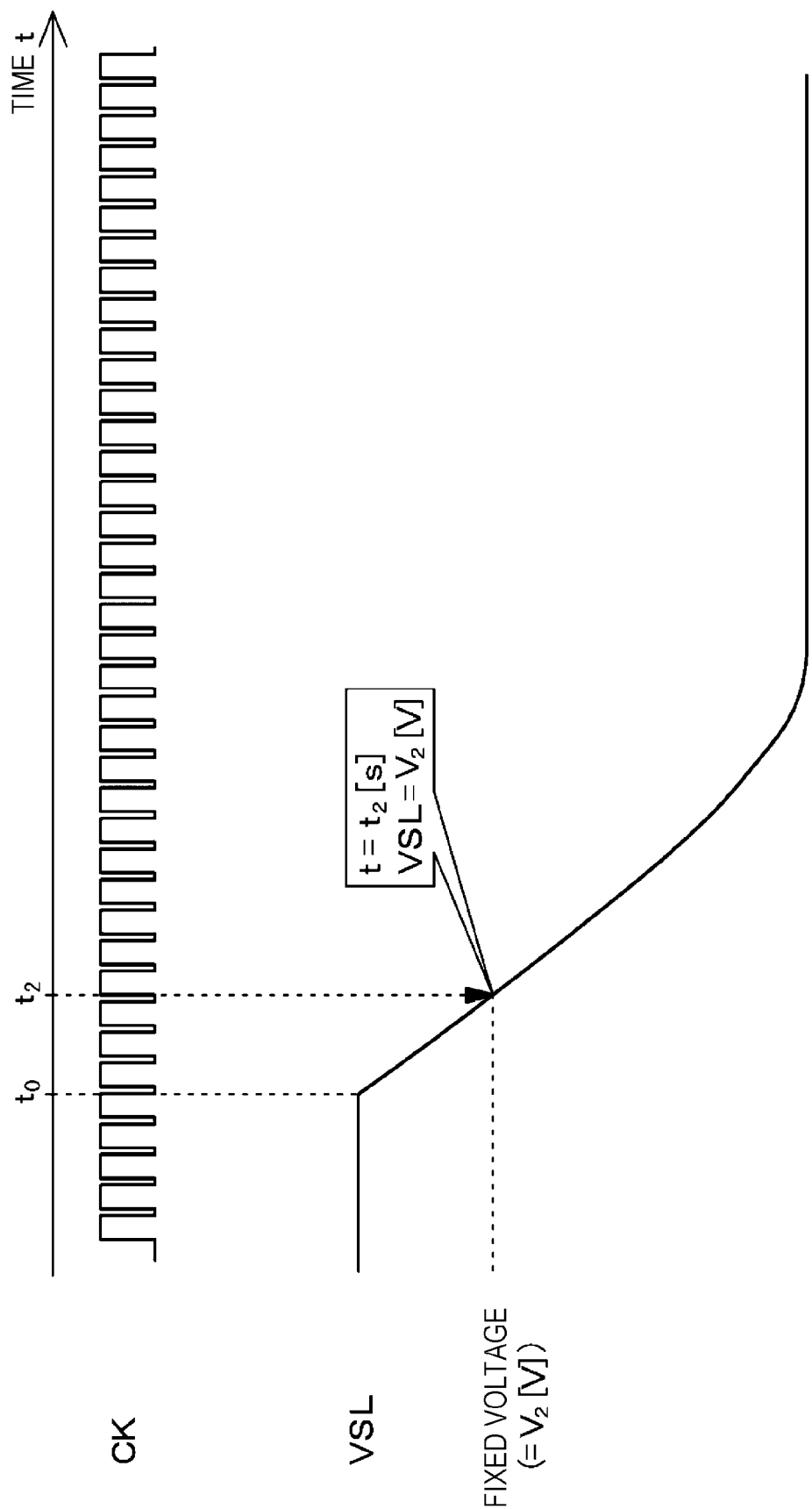
FIG. 13 is a timing waveform diagram illustrating a timing relationship between voltage values of a clock signal CLK and an analog pixel signal VSL in the analog-digital converter according to the fifth embodiment.

A timing relationship between voltage values of a clock signal CLK and an analog pixel signal VSL in the analog-digital converter 140 according to the fifth embodiment is illustrated in FIG. 13. FIG. 13 illustrates a case where the voltage value $V_2$ is set as a voltage value of the fixed voltage.

The comparator 146 compares the analog pixel signal VSL with the voltage value $V_2$ set by the fixed voltage setting unit 149 in the settling period of the analog pixel signal VSL, and an output is inverted at a timing when the voltage value of the analog pixel signal VSL intersects with the voltage value $V_2$. The counter circuit 147 performs a counting operation in synchronization with the clock signal CLK applied from a system control unit 17 and measures a time period from a timing (time $t_0$) when the settling of the analog pixel signal VSL is started to a timing (time $t_2$) when the voltage value of the analog pixel signal VSL intersects with the voltage value $V_2$ and the output of the comparator 146 is inverted.

The calculation unit 20 calculates a predicted convergence voltage value on the basis of the voltage value $V_2$ set by the fixed voltage setting unit 149 and the measurement time from the settling start time to $t_0$ the time $t_2$ when the voltage value of the analog pixel signal VSL intersects with the voltage value $V_2$. The predicted convergence voltage value of the analog pixel signal VSL can be calculated by applying the calculation method according to the first embodiment. Then, the calculation unit 20 sets the start voltage value $V_s$ at which the generation of the ramp wave of the reference signal RAMP is started to the vicinity of the calculated predicted convergence voltage value.

Hereinafter, the operations of the reference signal generation unit 144, the comparator 141, the counter circuit 142, the latch circuit 143, and the adder 148 performed under control by the system control unit 17 are basically the same as those in a case of the analog-digital converter 140 according to the fourth embodiment.

Note that, in the example described above, the single fixed voltage (voltage value $V_2$) is set. However, it is possible to provide a plurality of circuit units including the fixed voltage setting unit 149, the comparator 146, and the counter circuit 147 for each pixel column and set a plurality of fixed voltages. In this case, the plurality of predicted convergence voltage values is calculated on the basis of the plurality of fixed voltages. Therefore, the calculation unit 20 sets an average value of the plurality of predicted convergence voltage values to a final predicted convergence voltage value.

Furthermore, in the example described above, the fixed voltage setting unit 149 is provided to set the fixed voltage. However, a configuration can be adopted in which the reference signal generation unit 144 also serves as the fixed voltage setting unit 149. In this case, the reference signal generation unit 144 applies the fixed voltage (for example, voltage value $V_2$) to the comparator 146 at the time when the predicted convergence voltage value is calculated, generates a ramp wave from the start voltage value $V_s$ at the time when a digital value (convergence voltage value) is obtained, and applies the generated ramp wave to the comparator 141.

Figure 14:
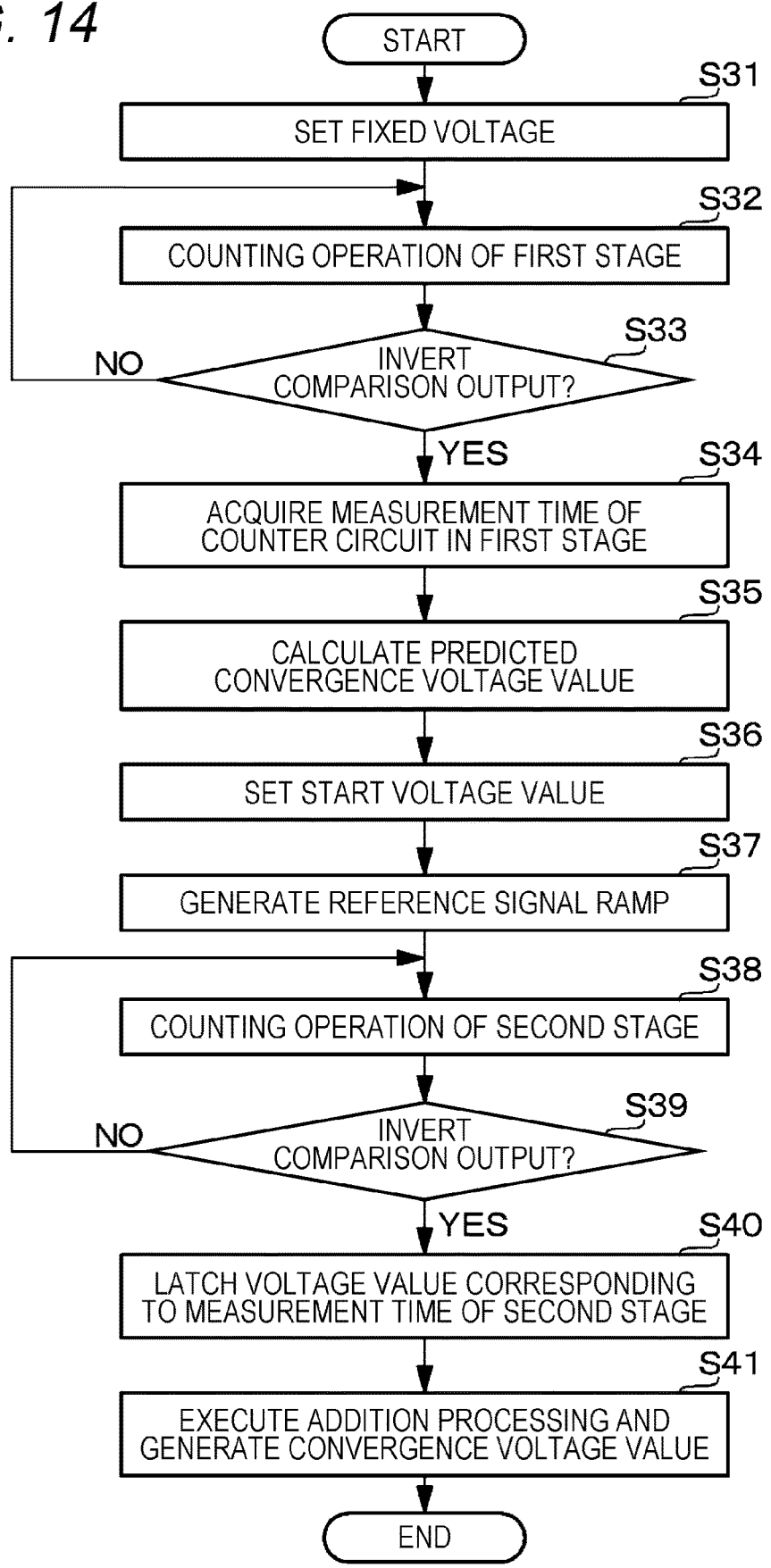
FIG. 14 is a flowchart illustrating a flow of analog-digital conversion processing by the analog-digital converter according to the fifth embodiment.

Subsequently, a flow of analog-digital conversion processing by the analog-digital converter 140 according to the fifth embodiment having the configuration described above will be described with reference to the flowchart in FIG. 14. The series of processing is executed under the control by the system control unit 17.

The system control unit 17 sets the fixed voltage (for example, voltage value $V_2$) by driving the fixed voltage setting unit 149 (step S31), and then, supplies the clock signal CLK to the counter circuit 147 in a first stage and starts a counting operation of the first stage (step S32).

The counting operation of the counter circuit 147 in the first stage is performed until the voltage value of the analog pixel signal VSL intersects with the fixed voltage and the output of the comparator 146 is inverted. Then, when the output of the comparator 146 is inverted and the counting operation of the counter circuit 147 in the first stage is stopped (YES in step S33), the system control unit 17 acquires a measurement time (count value) of the counter circuit 147 in the first stage (step S34). In the example illustrated in FIG. 13, the measurement time is acquired at the timing (time $t_2$) when the output of the comparator 146 is inverted.

Next, the calculation unit 20 calculates a predicted convergence voltage value after the settling of the analog pixel signal VSL is completed on the basis of the fixed voltage (voltage value $V_2$ in the present embodiment) set by the fixed voltage setting unit 149 and the measurement time of the counter circuit 147 in the first stage (step S35), and then, sets the start voltage value $V_s$ at which the generation of the ramp wave of the reference signal RAMP is started to the vicinity of the calculated predicted convergence voltage value (step S36).

Next, the system control unit 17 starts to generate the ramp wave of the reference signal RAMP from the start voltage value $V_s$ by driving the reference signal generation unit 144 (step S37), and then, supplies the clock signal CLK to the counter circuit 144 in the second stage and starts a counting operation of the second stage (step S38).

The counting operation of the counter circuit 142 in the second stage is performed until the ramp wave of the reference signal RAMP intersects with the voltage value of the analog pixel signal VSL and the output of the comparator 141 is inverted. Then, when the output of the comparator 141 is inverted and the counting operation of the counter circuit 142 in the second stage is stopped (YES in step S39), the system control unit 17 latches a voltage value corresponding to a measurement time (count value) of the second stage to the latch circuit 143 (step S40).

Next, the system control unit 17 drives the adder 148 and adds the voltage value latched by the latch circuit 143 (that is, voltage value corresponding to measurement time of counter circuit 142) and the start voltage value $V_s$ so as to generate the convergence voltage value of the analog pixel signal VSL (step S41).

As described above, according to the analog-digital converter 140 according to the fifth embodiment, the single-slope analog-digital converter can realize the analog-digital conversion method according to the first embodiment, the second embodiment, or the third embodiment that shortens an AD conversion time and increases a reading speed.

Sixth Embodiment

A sixth embodiment is a modification of the fourth embodiment or the fifth embodiment and is an example in which a single-slope analog-digital converter is mounted on a so-called vertical-reading CMOS image sensor of which pixel signal reading directions of odd-number pixel columns and even-number pixel columns are different from each other. An exemplary configuration of a column parallel analog-digital conversion unit including the single-slope analog-digital converter according to the sixth embodiment is illustrated in FIG. 15.

Figure 15:
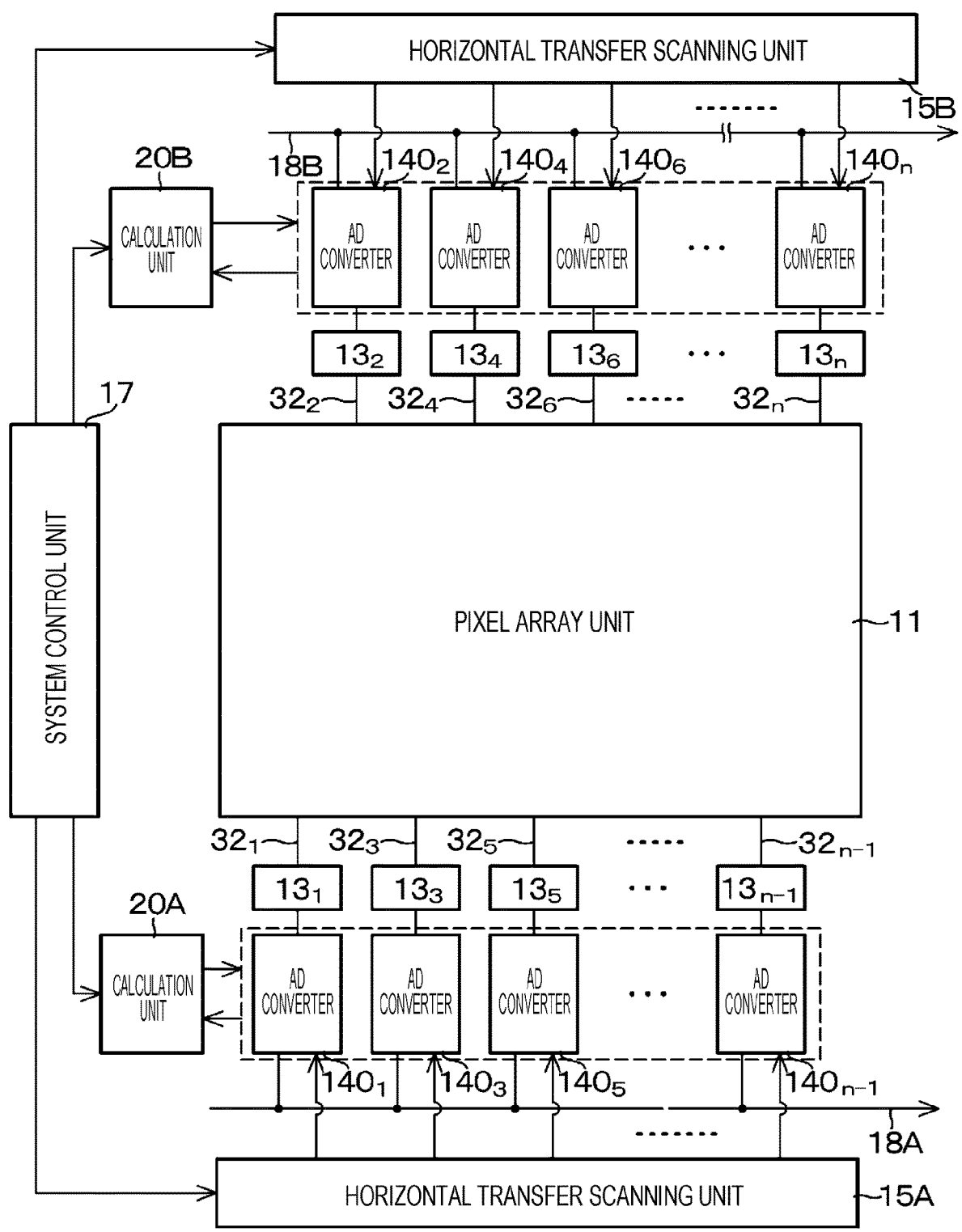
FIG. 15 is a block diagram illustrating an exemplary configuration of a column parallel analog-digital conversion unit including an analog-digital converter according to a sixth embodiment.

As illustrated in FIG. 15, the CMOS image sensor on which the single-slope analog-digital converter is mounted according to the fifth embodiment has a vertical reading configuration that reads pixel signals in one direction (downward in FIG. 15) along the odd-number pixel columns and reads pixel signals in the other direction (upward in FIG. 15) along the even-number pixel columns.

In the sixth embodiment, as described above, the vertical reading CMOS image sensor, in which the reading directions of the pixel signals in the odd-number pixel column and the even-number pixel column are different from each other, has a configuration in which a single-slope analog-digital converter 140 is provided every other pixel column for each reading direction. In the vertical reading CMOS image sensor, horizontal transfer scanning units 15A and 15B, calculation units 20A and 20B, or the like are provided for each reading direction.

In the vertical reading CMOS image sensor, as the single-slope analog-digital converter 140, the analog-digital converter according to the fourth embodiment or the fifth embodiment, that is, the single-slope analog-digital converter that can shorten an analog-digital conversion time and increase a reading speed is mounted.

According to the vertical reading CMOS image sensor, as a space for arrangement of the circuit portion for each pixel column in the analog-digital conversion unit 14, twice as much as the space in a single direction reading CMOS image sensor can be theoretically secured. Therefore, even if the circuit size of the single-slope analog-digital converter 140 is increased, a large circuit can be mounted.

Furthermore, the chip structure of the vertical reading CMOS image sensor can be a flat structure. However, a laminated structure is more preferable than the flat structure from viewpoint of electrical connection between vertical signal lines $32_1$ to $32_n$ and the circuit portion including the single-slope analog-digital converter 140.

<Modification>

In the above, the technology according to the present disclosure has been described on the basis of the preferred embodiments. However, the technology according to the present disclosure is not limited to the embodiments. The configuration and the structure of the imaging device described in the embodiments above are exemplary and can be appropriately changed. For example, in the above embodiments, a case where the single-slope analog-digital converter 140 is used as the analog-digital converter mounted on the imaging device has been described as an example. However, the application of the single-slope analog-digital converter 140 is not limited to the application to the analog-digital converter mounted on the imaging device. That is, the technology according to the present disclosure can be applied to a single-slope analog-digital converter that is generally used in various electronic circuits.

Application Example

Figure 16:
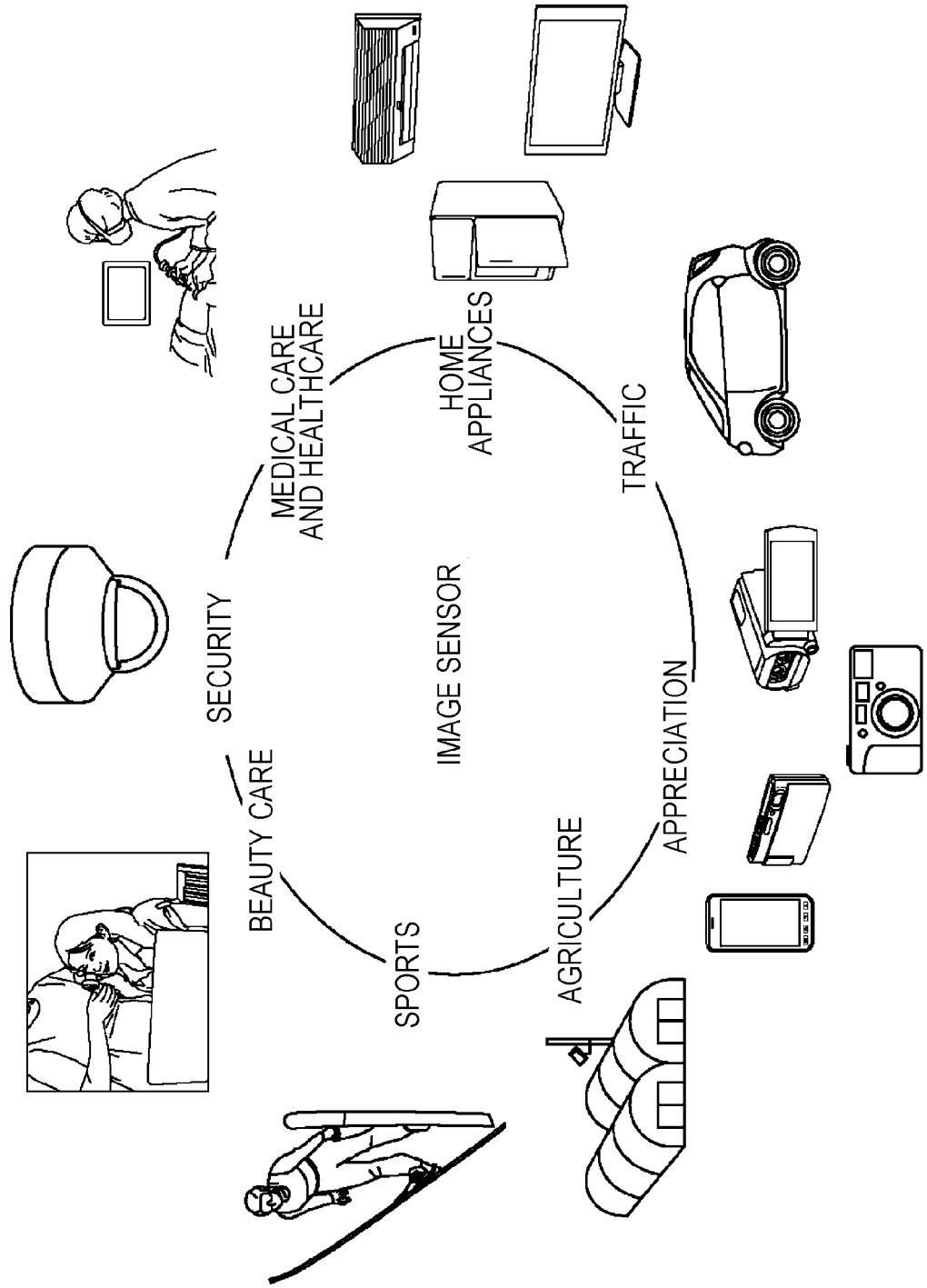
FIG. 16 is a diagram illustrating an applied example of the technology according to the present disclosure.

For example, as illustrated in FIG. 16, the CMOS image sensor 1 according to the present embodiment described above can be applied to various devices that sense light such as visible light, infrared light, ultraviolet light, or X-rays. Specific examples of various devices are listed below.

A device which captures an image to be used for appreciation, such as a digital camera and a portable device with a camera function A device which is used for traffic, such as an in-vehicle sensor for imaging the front, rear, surroundings, inside, and the like of a car for safe driving such as automatic stop, recognition of a driver's state, and the like, a monitoring camera for monitoring a traveling vehicle and a road, a distance measuring sensor for measuring a distance between vehicles, and the like A device which is used for home appliances, such as a TV, a refrigerator, an air conditioner to image a gesture of a user and operates the device according to the gesture A device which is used for medical care and healthcare, such as an endoscope and a device for performing angiography by receiving infrared light A device which is used for security, such as a security monitoring camera and a camera for person authentication A device which is used for beauty care, such as a skin measuring instrument for photographing skin and a microscope for photographing a scalp A device which is used for sports, such as an action camera and a wearable camera for sports and the like A device which is used for agriculture, such as a camera for monitoring conditions of fields and crops Applied Example of Technology According to Present Disclosure The technology according to the present disclosure can be applied to various products. Hereinafter, more specific applied examples will be described.

[Electronic Apparatus According to Present Disclosure]

Here, a case where the technology according to the present disclosure is applied to electronic apparatuses such as an imaging device such as a digital still camera or a video camera, a mobile terminal device having an imaging function such as a mobile phone, and a copying machine using an imaging device for an image reading unit will be described.

(Imaging Device)

Figure 17:
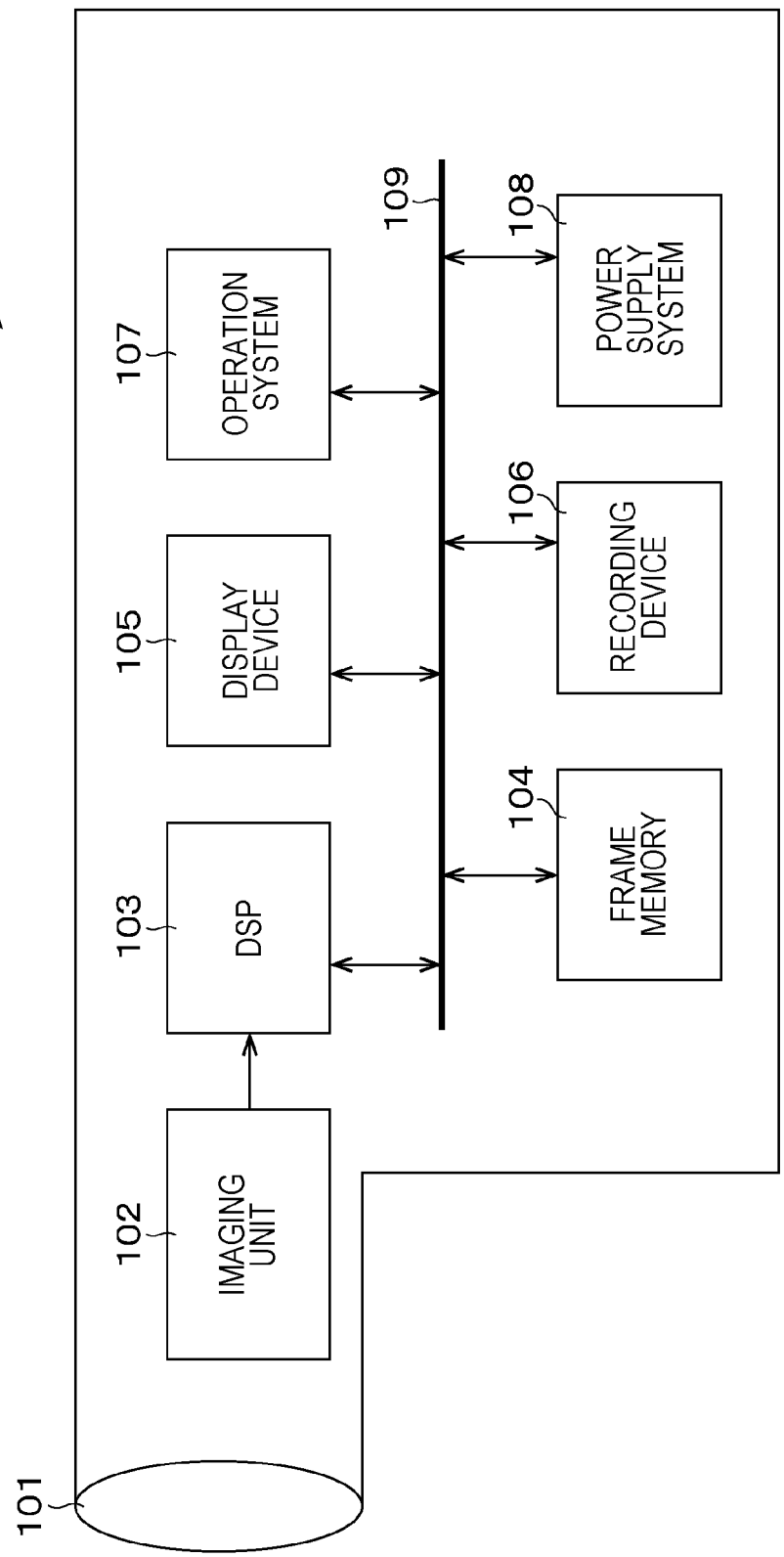
FIG. 17 is a block diagram illustrating a configuration of an imaging device that is an example of an electronic apparatus according to the present disclosure.

FIG. 17 is a block diagram illustrating a configuration of an imaging device that is an example of an electronic apparatus according to the present disclosure. As illustrated in FIG. 17, an imaging device 100 according to the present embodiment includes an imaging optical system 101 including a lens group or the like, an imaging unit 102, a Digital Signal Processor (DSP) circuit 103, a frame memory 104, a display device 105, a recording device 106, an operation system 107, a power supply system 108, and the like. Then, the DSP circuit 103, the frame memory 104, the display device 105, the recording device 106, the operation system 107, and the power supply system 108 are connected to each other via a bus line 109.

The imaging optical system 101 forms an image on an imaging surface of the imaging unit 102 by taking incident light (image light) from a subject. The imaging unit 102 converts an amount of the incident light focused on the imaging surface by the optical system 101 in pixel units into an electric signal and outputs the signal as a pixel signal. The DSP circuit 103 executes general camera signal processing, for example, white balance processing, demosaic processing, gamma correction processing, or the like.

The frame memory 104 is appropriately used for storing data in the process of the signal processing by the DSP circuit 103. The display device 105 includes a panel-type display device such as a liquid crystal display device or an organic electro luminescence (EL) display device and displays a moving image or a still image captured by the imaging unit 102. The recording device 106 records the moving image or the still image captured by the imaging unit 102 in a recording medium such as a portable semiconductor memory, an optical disk, or a hard disk drive (HDD).

The operation system 107 issues an instruction for operating various functions of the imaging device 100 under a user's operation. The power supply system 108 appropriately supplies various power to be operation power supplies of the DSP circuit 103, the frame memory 104, the display device 105, the recording device 106, and the operation system 107 to these devices.

In the imaging device 100 having the configuration described above, the CMOS image sensor 1 to which the technology according to the present disclosure is applied can be used as the imaging unit 102. According to the CMOS image sensor 1, an analog-digital conversion time can be shortened, and a reading speed of the analog-digital converter is increased. Therefore, it is possible to obtain a captured image at high speed.

Application Example to Mobile Body

The technology according to the present disclosure can be applied to various products. For example, the technology according to the present disclosure may be realized as an imaging device to be mounted on any type of mobile body such as a car, an electric vehicle, a hybrid electric vehicle, a motorcycle, a bicycle, a personal mobility, an airplane, a drone, a ship, and a robot, a construction machine, and an agricultural machine (tractor).

Figure 18:
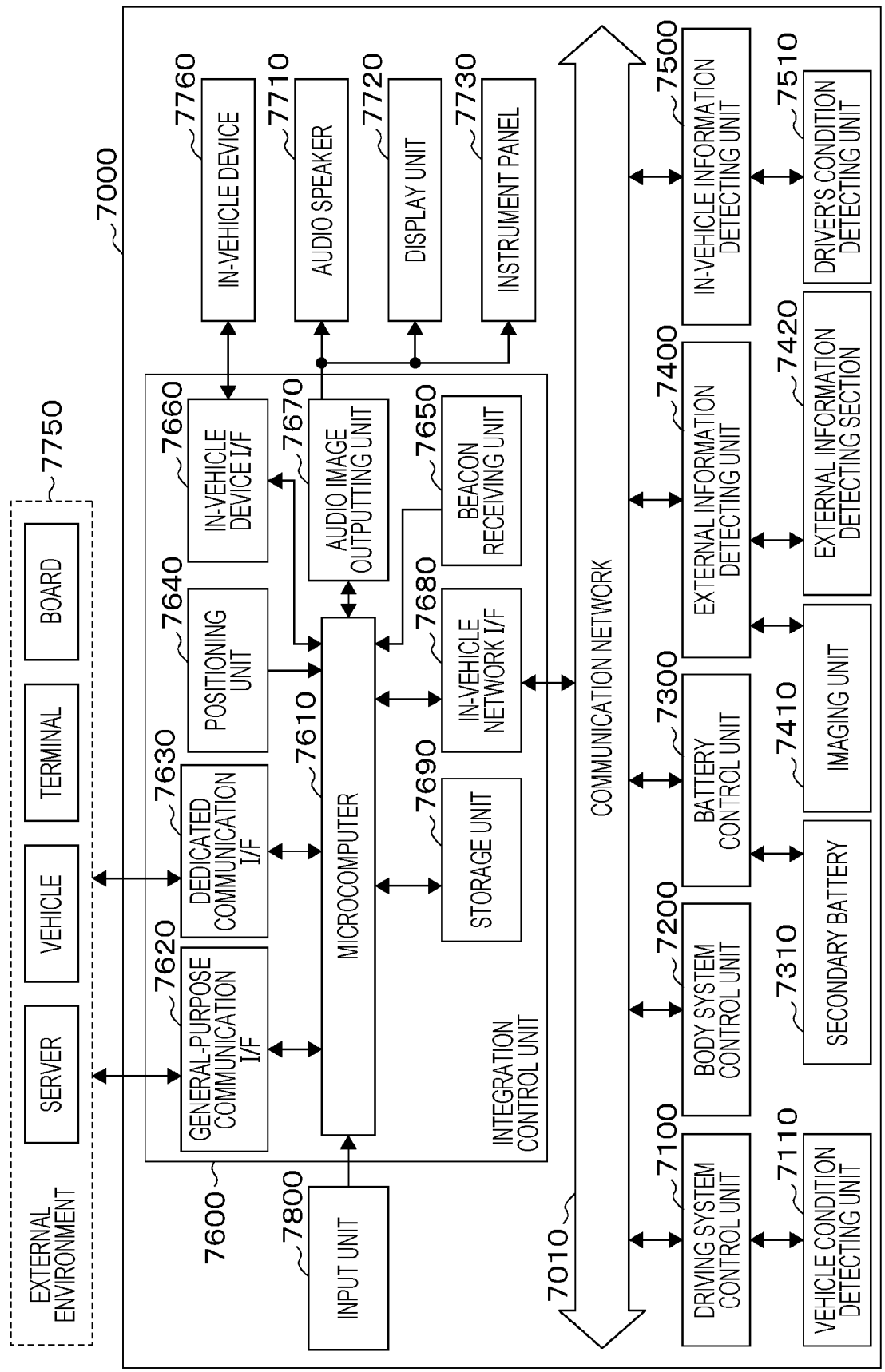
FIG. 18 is a block diagram of an exemplary schematic configuration of a vehicle control system which is an example of a mobile body control system to which the technology according to the present disclosure may be applied.

FIG. 18 is a block diagram of an exemplary schematic configuration of a vehicle control system 7000 which is an example of a mobile body control system to which the technology according to the present disclosure may be applied. The vehicle control system 7000 includes a plurality of electronic control units connected via a communication network 7010. In the example illustrated in FIG. 18, the vehicle control system 7000 includes a driving system control unit 7100, a body system control unit 7200, a battery control unit 7300, an external information detecting unit 7400, an in-vehicle information detecting unit 7500, and an integration control unit 7600. The communication network 7010 for connecting the plurality of control units may be an in-vehicle communication network compliant with an optional standard, for example, the Controller Area Network (CAN), Local Interconnect Network (LIN), the Local Area Network (LAN), the FlexRay (registered trademark), or the like.

Each control unit includes a microcomputer which executes operation processing in accordance with various programs, a storage unit which stores the program executed by the microcomputer or a parameter or the like used for various operations, and a driving circuit which drives various devices to be controlled. Each control unit includes a network I/F to communicate with other control unit via the communication network 7010 and a communication I/F to communicate with devices, sensors, or the like inside/outside the vehicle by wired or wireless communication. In FIG. 18, as functional configurations of the integration control unit 7600, a microcomputer 7610, a general-purpose communication I/F 7620, a dedicated communication I/F 7630, a positioning unit 7640, a beacon receiving unit 7650, an in-vehicle device I/F 7660, an audio image outputting unit 7670, an in-vehicle network I/F 7680, and a storage unit 7690 are illustrated. Other control unit similarly includes a microcomputer, a communication I/F, a storage unit, and the like.

The driving system control unit 7100 controls an operation of a device relating to a driving system of the vehicle in accordance with various programs. For example, the driving system control unit 7100 functions as a control device of a device such as a driving force generating device to generate a driving force of the vehicle such as an internal combustion engine or a driving motor, a driving force transmitting mechanism to transmit the driving force to wheels, a steering mechanism which adjusts a steering angle of the vehicle, and a braking device which generates a braking force of the vehicle. The driving system control unit 7100 may have a function as a control device such as an Antilock Brake System (ABS) or an Electronic Stability Control (ESC).

The driving system control unit 7100 is connected to a vehicle condition detecting unit 7110. The vehicle condition detecting unit 7110 includes at least one of, for example, a gyro sensor which detects an angular velocity of a shaft rotary motion of a vehicle body, an acceleration sensor which detects an acceleration of the vehicle, and sensors to detect an operation amount of an accelerator pedal, an operation amount of a brake pedal, a steering angle of a steering wheel, an engine speed, a rotational speed of a wheel, or the like. The driving system control unit 7100 executes operation processing by using the signal input from the vehicle condition detecting unit 7110 and controls an internal combustion engine, a driving motor, an electric power steering device, a brake device, or the like.

The body system control unit 7200 controls operations of various devices attached to the vehicle body in accordance with various programs. For example, the body system control unit 7200 functions as a control device of a keyless entry system, a smart key system, a power window device, or various lamps such as a head lamp, a back lamp, a brake lamp, a direction indicator, or a fog lamp. In this case, a radio wave transmitted from a portable machine for substituting a key or signals of various switches may be input to the body system control unit 7200. The body system control unit 7200 receives the input of the radio wave or the signal and controls a door locking device, the power window device, the lamp, and the like of the vehicle.

The battery control unit 7300 controls a secondary battery 7310 which is a power supply source of the driving motor according to various programs. For example, a battery device including the secondary battery 7310 inputs information such as a battery temperature, a battery output voltage, or a residual capacity of the battery, to the battery control unit 7300. The battery control unit 7300 executes operation processing by using these signals and controls temperature regulation of the secondary battery 7310 or controls a cooling device included in the battery device and the like.

The external information detecting unit 7400 detects external information of the vehicle including the vehicle control system 7000. For example, the external information detecting unit 7400 is connected to at least one of an imaging unit 7410 or an external information detecting section 7420. The imaging unit 7410 includes at least one of a time of flight (ToF) camera, a stereo camera, a monocular camera, an infrared camera, or other camera. The external information detecting section 7420 includes, for example, at least one of an environment sensor to detect current whether or meteorological phenomenon or a surrounding information detecting sensor to detect other vehicle, an obstacle, a pedestrian, or the like around the vehicle including the vehicle control system 7000.

The environment sensor may be, for example, at least one of a raindrop sensor which detects rainy weather, a fog sensor which detects fog, a sunshine sensor which detects a sunshine degree, or a snow sensor which detects snow fall. The surrounding information detecting sensor may be at least one of an ultrasonic sensor, a radar apparatus, and a light detection and ranging, laser imaging detection and ranging (LIDAR) device. The imaging unit 7410 and the external information detecting section 7420 may be included as independent sensors and devices and may be included as a device formed by integrating a plurality of sensors and devices.

Figure 19:
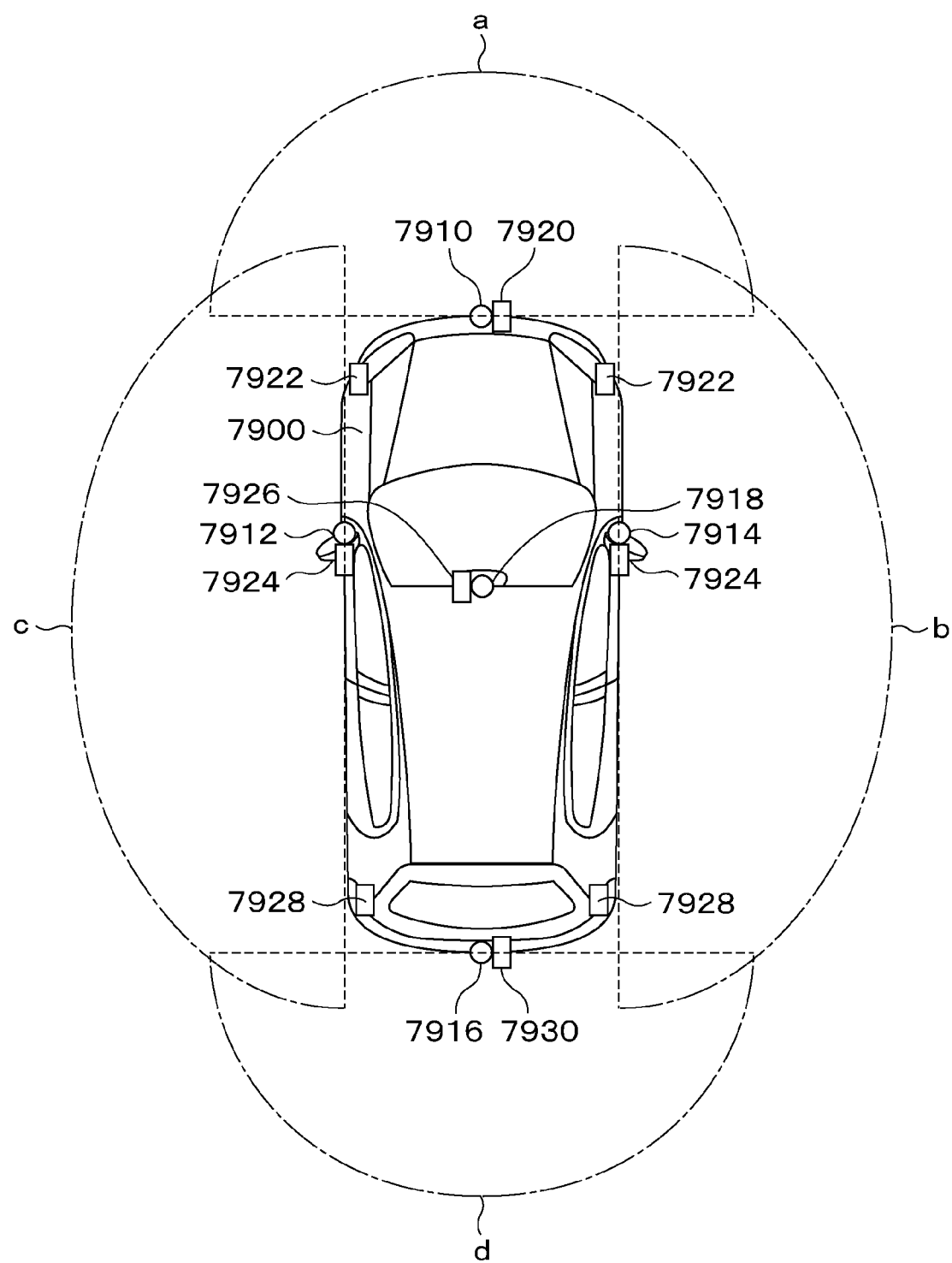
FIG. 19 is a diagram illustrating exemplary set positions of imaging units.

Here, in FIG. 19, an example of set positions of the imaging units 7410 and the external information detecting sections 7420 is illustrated. Each of imaging units 7910, 7912, 7914, 7916, and 7918 are provided in at least one of, for example, a front nose, a side mirror, a rear bumper, a back door, or an upper side of a windshield in the vehicle interior of a vehicle 7900. The imaging unit 7910 provided in the front nose and the imaging unit 7918 provided on the upper side of the windshield in the vehicle interior mainly obtain images on the front side of the vehicle 7900. The imaging units 7912 and 7914 provided in the side mirrors mainly obtain images on the sides of the vehicle 7900. The imaging unit 7916 provided in the rear bumper or the back door mainly obtains an image on the back side of the vehicle 7900. The imaging unit 7918 provided on the upper side of the windshield in the vehicle interior is mainly used to detect a preceding vehicle, a pedestrian, an obstacle, a traffic light, a traffic sign, a traffic lane, or the like.

Note that, in FIG. 19, exemplary photographing ranges of the respective imaging units 7910, 7912, 7914, and 7916 are illustrated. An imaging range a indicates an imaging range of the imaging unit 7910 provided in the front nose, and imaging ranges b and c respectively indicate imaging ranges of the imaging units 7912 and 7914 provided in the side mirrors. An imaging range d indicates an imaging range of the imaging unit 7916 provided in the rear bumper or the back door. For example, image data captured by the imaging units 7910, 7912, 7914, and 7916 is superposed so that a bird's-eye image of the vehicle 7900 viewed from above can be obtained.

External information detecting sections 7920, 7922, 7924, 7926, 7928, and 7930 respectively provided on the front, rear, side, corner, and upper side of the windshield of the vehicle interior of the vehicle 7900 may be, for example, ultrasonic sensors or radar apparatuses. The external information detecting sections 7920, 7926, and 7930 provided in the front nose, the rear bumper, the back door, and the upper side of the windshield in the vehicle interior of the vehicle 7900 may be, for example, LIDAR devices. The external information detecting sections 7920 to 7930 are mainly used to detect a preceding vehicle, a pedestrian, an obstacle, or the like.

The description will be continued with reference to FIG. 18 again. The external information detecting unit 7400 makes the imaging unit 7410 capture an image outside the vehicle and receives the captured image data. Furthermore, the external information detecting unit 7400 receives detection information from the external information detecting section 7420 connected to the external information detecting unit 7400. In a case where the external information detecting section 7420 is an ultrasonic sensor, a radar apparatus, or a LIDAR device, the external information detecting unit 7400 makes the external information detecting section 7420 transmit ultrasonic waves, radio waves, or the like and receives information regarding the received reflected waves. The external information detecting unit 7400 may execute processing for detecting an object such as a person, a car, an obstacle, a sign, or letters on the road or distance detection processing on the basis of the received information. The external information detecting unit 7400 may execute environment recognition processing for recognizing rain, fog, a road surface condition, or the like on the basis of the received information. The external information detecting unit 7400 may calculate a distance to an object outside the vehicle on the basis of the received information.

Furthermore, the external information detecting unit 7400 may execute image recognition processing for recognizing a person, a car, an obstacle, a sign, letters on the road, or the like or the distance detection processing on the basis of the received image data. The external information detecting unit 7400 may generate a bird's-eye image or a panoramic image by executing processing such as distortion correction or positioning on the received image data and synthesizing pieces of the image data captured by the different imaging units 7410. The external information detecting unit 7400 may execute viewpoint conversion processing by using the pieces of the image data captured by the different imaging units 7410.

The in-vehicle information detecting unit 7500 detects in-vehicle information. The in-vehicle information detecting unit 7500 is connected to, for example, a driver's condition detecting unit 7510 for detecting a condition of a driver. The driver's condition detecting unit 7510 may include a camera for imaging the driver, a biosensor for detecting biological information of the driver, a microphone for collecting sound in the vehicle interior, or the like. The biosensor is provided, for example, in a seat surface, a steering wheel, or the like and detects biological information of an occupant who sits on the seat or a driver who holds a steering wheel. On the basis of the detection information input from the driver's condition detecting unit 7510, the in-vehicle information detecting unit 7500 may calculate a fatigue degree or a concentration degree of the driver and may determine whether or not the driver falls asleep. The in-vehicle information detecting unit 7500 may execute processing such as noise canceling processing on a collected audio signal.

The integration control unit 7600 controls a general operation in the vehicle control system 7000 according to various programs. The integration control unit 7600 is connected to an input unit 7800. The input unit 7800 is realized by a device, to which the occupant can perform an input operation, for example, on a touch panel, a button, a microphone, a switch, a lever, or the like. The integration control unit 7600 may receive data obtained by recognizing sound input by the microphone. The input unit 7800 may be, for example, a remote control device using infrared rays or other radio waves and may be an external connection device such as a mobile phone or a Personal Digital Assistant (PDA) corresponding to the operation of the vehicle control system 7000. The input unit 7800 may be, for example, a camera. In this case, the occupant can input information by using a gesture. Alternatively, data obtained by detecting a movement of a wearable device worn by an occupant may be input. Moreover, the input unit 7800 may include, for example, an input control circuit or the like which generates an input signal on the basis of the information input by the occupant and the like by using the input unit 7800 and outputs the input signal to the integration control unit 7600. The occupant and the like input various data and instruct a processing operation to the vehicle control system 7000 by operating the input unit 7800.

The storage unit 7690 may include a Read Only Memory (ROM) for storing various programs executed by a microcomputer and a Random Access Memory (RAM) for storing various parameters, calculation results, a sensor value, or the like. Furthermore, the storage unit 7690 may be realized by a magnetic storage device such as a Hard Disc Drive (HDD), a semiconductor storage device, an optical storage device, a magneto-optical storage device, or the like.

The general-purpose communication I/F 7620 is a general-purpose communication I/F that mediates communication with various devices existing in an external environment 7750. The general-purpose communication I/F 7620 may implement a cellular communication protocol such as the Global System of Mobile communications (GSM) (registered trademark), the WiMAX, the Long Term Evolution (LTE), or the LTE-Advanced (LTE-A) or other wireless communication protocol such as wireless LANs (Wi-Fi (registered trademark)) and the Bluetooth (registered trademark). For example, the general-purpose communication I/F 7620 may be connected to a device (for example, application server or control server) existing on an external network (for example, the Internet, cloud network, or company-specific network) via a base station or an access point. Furthermore, the general-purpose communication I/F 7620 may be connected to a terminal existing near the vehicle (for example, terminal of driver, pedestrian, or shop or Machine Type Communication (MTC) terminal), for example, by using the Peer To Peer (P2P) technology.

The dedicated communication I/F 7630 supports a communication protocol established to be used for the vehicle. The dedicated communication I/F 7630 may, for example, implement a standard protocol such as the Wireless Access in Vehicle Environment (WAVE) which is a combination of the IEEE 802.11p of a lower layer and the IEEE 1609 of an upper layer, the Dedicated Short Range Communications (DSRC), or a cellular communication protocol. The dedicated communication I/F 7630 typically performs V2X communication which is a concept including one or more of vehicle to vehicle communication, vehicle to infrastructure communication, vehicle to home communication, and vehicle to pedestrian communication.

For example, the positioning unit 7640 receives a GNSS signal (for example, GPS signal from Global Positioning System (GPS) satellite) from a Global Navigation Satellite System (GNSS) satellite and executes positioning. Then, the positioning unit 7640 generates position information including a latitude, a longitude, and a height of the vehicle. Note that the positioning unit 7640 may specify the current position by exchanging a signal with a wireless access point or may obtain the position information from a terminal such as a mobile phone, a PHS, or a smartphone having a positioning function.

The beacon receiving unit 7650, for example, receives radio waves or electromagnetic waves transmitted from a wireless station installed on the road or the like and obtains information including the current position, traffic congestion, a closed area, a required time, or the like. Note that the function of the beacon receiving unit 7650 may be included in the dedicated communication I/F 7630 described above.

The in-vehicle device I/F 7660 is a communication interface for mediating connection between the microcomputer 7610 and various in-vehicle devices 7760 in the vehicle. The in-vehicle device I/F 7660 may establish wireless connection by using a wireless communication protocol such as a wireless LAN, the Bluetooth (registered trademark), Near Field Communication (NFC), or a wireless USB (WUSB). Furthermore, the in-vehicle device I/F 7660 may establish wired connection such as a Universal Serial Bus (USB), a High-Definition Multimedia Interface (HDMI) (registered trademark), or a Mobile High-definition Link (MHL) via a connection terminal (and cable as necessary) which is not illustrated. The in-vehicle device 7760 may include, for example, at least one of a mobile device or a wearable device owned by the occupant, or an information device carried in or attached to the vehicle. Furthermore, the in-vehicle device 7760 may include a navigation device which searches for a route to an arbitrary destination. The in-vehicle device I/F 7660 exchanges a control signal or a data signal with these in-vehicle devices 7760.

The in-vehicle network I/F 7680 is an interface for mediating communication between the microcomputer 7610 and the communication network 7010. The in-vehicle network I/F 7680 transmits and receives a signal and the like in accordance with a predetermined protocol supported by the communication network 7010.

The microcomputer 7610 of the integration control unit 7600 controls the vehicle control system 7000 in accordance with various programs on the basis of information obtained via at least one of the general-purpose communication I/F 7620, the dedicated communication I/F 7630, the positioning unit 7640, the beacon receiving unit 7650, the in-vehicle device I/F 7660, or the in-vehicle network I/F 7680. For example, the microcomputer 7610 may calculate a control target value of a driving force generating device, a steering mechanism, or a braking device on the basis of the obtained information inside and outside the vehicle and output a control instruction to the driving system control unit 7100. For example, the microcomputer 7610 may perform cooperative control to realize a function of an Advanced Driver Assistance System (ADAS) including collision avoidance or impact relaxation of the vehicle, a following travel based on a distance between vehicles, a vehicle speed maintaining travel, a vehicle collision warning, a lane deviation warning of the vehicle, or the like. Furthermore, the microcomputer 7610 controls the driving force generating device, the steering mechanism, the braking device, or the like on the basis of the obtained information around the vehicle so as to perform cooperative control for automatic drive in which the vehicle autonomously travels without depending on an operation by the driver and the like.

The microcomputer 7610 may generate three-dimensional distance information between the vehicle and an object such as a building and a person around the vehicle and create local map information including peripheral information of the current position of the vehicle on the basis of the information obtained via at least one of the general-purpose communication I/F 7620, the dedicated communication I/F 7630, the positioning unit 7640, the beacon receiving unit 7650, the in-vehicle device I/F 7660, and the in-vehicle network I/F 7680. Furthermore, the microcomputer 7610 may predict a danger such as a collision of the vehicle, approach of a pedestrian or the like, or entry to the closed road on the basis of the obtained information and generate a warning signal. The warning signal may be, for example, a signal to generate warning sound or to light a warning lamp.

The audio image outputting unit 7670 transmits an output signal which is at least one of a voice or an image to an output device which can visually or auditorily notify the occupant of the vehicle or the outside of the vehicle of information. In the example in FIG. 18, an audio speaker 7710, a display unit 7720, and an instrument panel 7730 are exemplified as the output devices. The display unit 7720 may include, for example, at least one of an on-board display or a head-up display. The display unit 7720 may have an Augmented Reality (AR) display function. The output device may be a device other than the above devices, such as a headphone, a wearable device such as a glass-type display worn by the occupant, a projector, or a lamp. In a case where the output device is a display device, the display device visually displays the result obtained by various processing executed by the microcomputer 7610 or information received from the other control unit in various formats such as a text, an image, a chart, and a graph. Furthermore, in a case where the output device is a sound output device, the sound output device converts an audio signal including reproduced audio data, acoustic data, or the like into an analog signal and auditorily outputs the signal.

Note that, in the example illustrated in FIG. 18, at least two control units connected via the communication network 7010 may be integrated as a single control unit. Alternatively, each control unit may include a plurality of control units. Moreover, the vehicle control system 7000 may include other control unit which is not illustrated. Furthermore, in the above description, other control unit may have a part of or all of the function of any one of controls units. That is, if information can be transmitted and received via the communication network 7010, any one of the control units may execute predetermined operation processing. Similarly, a sensor or a device connected to any one of the control units may be connected to the other control unit, and the plurality of control units may transmit and receive detection information to/from each other via the communication network 7010.

An example of the vehicle control system to which the technology according to the present disclosure may be applied has been described above. The technology according to the present disclosure may be applied to, for example, the imaging units 7910, 7912, 7914, 7916, and 7918 and the external information detecting sections 7920, 7922, 7924, 7926, 7928, and 7930 in the configuration described above. Then, by applying the technology according to the present disclosure, it is possible to obtain a captured image at high speed by increasing the reading speed of the single-slope analog-digital converter used for the imaging device. Therefore, for example, it is possible to construct a vehicle control system that can instantly acquire information regarding an imaging target.

<Configuration that Present Disclosure can Have>

Note that the present disclosure can employ the following configurations.

<<A. Analog-Digital Converter>>

[A-1] An analog-digital converter including:

a voltage acquisition unit configured to acquire a voltage value of an analog signal in a settling period of the analog signal;

a calculation unit configured to calculate a predicted convergence voltage value of the analog signal on the basis of the voltage value of the analog signal acquired by the voltage acquisition unit;

a reference signal generation unit configured to generate a ramp wave reference signal on the basis of the predicted convergence voltage value calculated by the calculation unit;

a comparison unit configured to compare the voltage value of the analog signal with the ramp wave of the reference signal;

a measurement unit configured to measure a time period from a generation timing of the reference signal to a time before the voltage value of the analog signal intersects with the ramp wave of the reference signal; and an addition unit configured to derive a convergence voltage value of the analog signal by adding a voltage value corresponding to the time period measured by the measurement unit and a voltage value based on the predicted convergence voltage value.

[A-2] The analog-digital converter according to [A-1], in which the reference signal generation unit maintains a first voltage value during the settling period of the analog signal, changes a voltage value at a first inclination to a voltage value based on the predicted convergence voltage value after the analog signal is converged, and then, generates a ramp wave that changes the voltage value at a second inclination smaller than the first inclination.

[A-3] The analog-digital converter according to [A-2], in which
the voltage value based on the predicted convergence voltage value is a voltage value at which generation of the ramp wave that changes the voltage value at the second inclination is started.

[A-4] The analog-digital converter according to [A-1], in which
the voltage acquisition unit compares the voltage value of the analog signal with the ramp wave in the settling period of the analog signal and acquires a voltage value of the analog signal when the ramp wave intersects.

[A-5] The analog-digital converter according to [A-4], in which
the calculation unit calculates the predicted convergence voltage value of the analog signal by using the voltage value of the analog signal acquired by the voltage acquisition unit and a time period from start of settling of the analog signal to a time before the voltage value of the analog signal intersects with the ramp wave.

[A-6] The analog-digital converter according to [A-1], in which
the calculation unit calculates the predicted convergence voltage value of the analog signal by using a fixed voltage that has been set in advance and a time period from start of settling of the analog signal to a time before the voltage value of the analog signal intersects with the fixed voltage.

<<B. Analog-Digital Conversion Method>>

[B-1] An analog-digital conversion method for executing processing including:
a step of acquiring a voltage value of an analog signal in a settling period of the analog signal and calculating a predicted convergence voltage value of the analog signal on the basis of the acquired voltage value of the analog signal;
a step of generating a ramp wave reference signal on the basis of the predicted convergence voltage value of the analog signal;
a step of measuring a time period from a generation timing of the ramp wave reference signal to a time before the voltage value of the analog pixel signal intersects with the ramp wave of the reference signal; and
a step of deriving a convergence voltage value of the analog signal by adding a voltage value corresponding to the measured time period and a voltage value based on the predicted convergence voltage value.

[B-2] The analog-digital conversion method according to [B-1], in which
a first voltage value is maintained during the settling period of the analog signal, a voltage value is changed at a first inclination to a voltage value based on the predicted convergence voltage value after the analog signal is converged, and then, a ramp wave is generated that changes the voltage value at a second inclination smaller than the first inclination.

[B-3] The analog-digital conversion method according to [B-2], in which
the voltage value based on the predicted convergence voltage value is a start voltage value at which generation of the ramp wave that changes the voltage value at the second inclination is started.

[B-4] The analog-digital conversion method according to [B-1], in which
the voltage value of the analog signal is compared with the ramp wave in the settling period of the analog signal, and a voltage value of the analog signal when the ramp wave intersects is acquired.

[B-5] The analog-digital conversion method according to [B-4], in which
the predicted convergence voltage value of the analog signal is calculated by using the voltage value of the analog signal acquired by the voltage acquisition unit and a time period from start of settling of the analog signal to a time before the voltage value of the analog signal intersects with the ramp wave.

[B-6] The analog-digital conversion method according to [B-1], in which
the calculation unit calculates the predicted convergence voltage value of the analog signal by using a fixed voltage that has been set in advance and a time period from start of settling of the analog signal to a time before the voltage value of the analog signal intersects with the fixed voltage.

[B-7] The analog-digital conversion method according to [B-1], in which
the voltage values of the analog signal are acquired a plurality of times at equal intervals in the settling period of the analog signal.

[B-8] The analog-digital conversion method according to [B-1], in which
the voltage values of the analog signal are acquired a plurality of times at unequal intervals in the settling period of the analog signal.

[B-9] The analog-digital conversion method according to [B-1], in which
a gain of an analog-digital converter is adjusted according to luminance information.

<<C. Imaging Device>>

[C-1] An imaging device including:
a pixel array unit configured by arranging pixels including photoelectric conversion units in a matrix; and
an analog-digital converter configured to convert an analog pixel signal output from the pixel into a digital pixel signal, in which
the analog-digital converter includes:
a voltage acquisition unit that acquires a voltage value of the analog pixel signal in a settling period of the analog pixel signal;
a calculation unit that calculates a predicted convergence voltage value of the analog signal on the basis of the voltage value of the analog signal acquired by the voltage acquisition unit;
a reference signal generation unit that generates a ramp wave reference signal on the basis of the predicted convergence voltage value calculated by the calculation unit;
a comparison unit that compares the voltage value of the analog signal with the ramp wave of the reference signal;
a measurement unit that measures a time period from a generation timing of the reference signal to a time before the voltage value of the analog signal intersects with the ramp wave of the reference signal; and
an addition unit that derives a convergence voltage value of the analog signal by adding a voltage value corresponding to the time period measured by the measurement unit and a voltage value based on the predicted convergence voltage value.

[C-2] The imaging device according to [C-1], in which
the reference signal generation unit maintains a first voltage value during the settling period of the analog signal, changes a voltage value at a first inclination to a voltage value based on the predicted convergence voltage value after the analog signal is converged, and then, generates a ramp wave that changes the voltage value at a second inclination smaller than the first inclination.

[C-3] The imaging device according to [C-2], in which
the voltage value based on the predicted convergence voltage value is a voltage value at which generation of the ramp wave that changes the voltage value at the second inclination is started.

[C-4] The imaging device according to [C-1], in which
the voltage acquisition unit compares the voltage value of the analog signal with the ramp wave in the settling period of the analog signal and acquires a voltage value of the analog signal when the ramp wave intersects.

[C-5] The imaging device according to [C-4], in which
the calculation unit calculates the predicted convergence voltage value of the analog signal by using the voltage value of the analog signal acquired by the voltage acquisition unit and a time period from start of settling of the analog signal to a time before the voltage value of the analog signal intersects with the ramp wave.

[C-6] The imaging device according to [C-1], in which
the calculation unit calculates the predicted convergence voltage value of the analog signal by using a fixed voltage that has been set in advance and a time period from start of settling of the analog signal to a time before the voltage value of the analog signal intersects with the fixed voltage.

[C-7] The imaging device according to [C-1], in which
pixel signal reading directions in an odd-number pixel column and an even-number pixel column are different from each other, and
the analog-digital converter is provided every other pixel column for each reading direction.

[C-8] The imaging device according to [C-7], having a structure in which at least two semiconductor substrates including a first semiconductor substrate and a second semiconductor substrate are laminated, in which
a pixel array unit is formed on the first semiconductor substrate, and
the analog-digital converter is formed on the second semiconductor substrate.

REFERENCE SIGNS LIST

1 CMOS image sensor
2 Pixel
11 Pixel array unit
12 Row selection unit
13 Constant current source unit
14 Analog-digital conversion unit
15 Horizontal transfer scanning unit
16 Signal processing unit
17 System control unit
18 Horizontal transfer line
19 Reference signal generation unit
20 Calculation unit
21 Photodiode
22 Transfer transistor
23 Reset transistor
24 Amplifier transistor
25 Selection transistor
$31_1$ to $31_m$ Pixel driving line
$32_1$ to $32_n$ Vertical signal line
140 Single-slope analog-digital converter
141, 146 Comparator
142, 147 Counter circuit
143 Latch circuit
144, 145 Reference signal generation unit
148 Adder
149 Fixed voltage setting unit

The invention claimed is:

1. An analog-digital converter comprising:
a voltage acquisition unit configured to acquire a voltage value of an analog signal in a settling period of the analog signal;
a calculation unit configured to calculate a predicted convergence voltage value of the analog signal on a basis of the voltage value of the analog signal acquired by the voltage acquisition unit;
a reference signal generation unit configured to generate a ramp wave reference signal on a basis of the predicted convergence voltage value calculated by the calculation unit;
a comparison unit configured to compare the voltage value of the analog signal with the ramp wave of the reference signal;
a measurement unit configured to measure a time period from a generation timing of the reference signal to a time before the voltage value of the analog signal intersects with the ramp wave of the reference signal; and
an addition unit configured to derive a convergence voltage value of the analog signal by adding a voltage value corresponding to the time period measured by the measurement unit and a voltage value based on the predicted convergence voltage value.

2. The analog-digital converter according to claim 1, wherein
the reference signal generation unit maintains a first voltage value during the settling period of the analog signal, changes a voltage value at a first inclination to a voltage value based on the predicted convergence voltage value after the analog signal is converged, and then, generates a ramp wave that changes the voltage value at a second inclination smaller than the first inclination.

3. The analog-digital converter according to claim 2, wherein
the voltage value based on the predicted convergence voltage value is a voltage value at which generation of the ramp wave that changes the voltage value at the second inclination is started.

4. The analog-digital converter according to claim 1, wherein
the voltage acquisition unit compares the voltage value of the analog signal with the ramp wave in the settling period of the analog signal and acquires a voltage value of the analog signal when the ramp wave intersects.

5. The analog-digital converter according to claim 4, wherein
the calculation unit calculates the predicted convergence voltage value of the analog signal by using the voltage value of the analog signal acquired by the voltage acquisition unit and a time period from start of settling of the analog signal to a time before the voltage value of the analog signal intersects with the ramp wave.

6. The analog-digital converter according to claim 1, wherein
the calculation unit calculates the predicted convergence voltage value of the analog signal by using a fixed voltage that has been set in advance and a time period from start of settling of the analog signal to a time before the voltage value of the analog signal intersects with the fixed voltage.

7. An analog-digital conversion method for executing processing comprising:
a step of acquiring a voltage value of an analog signal in a settling period of the analog signal and calculating a predicted convergence voltage value of the analog signal on a basis of the acquired voltage value of the analog signal;

a step of generating a ramp wave reference signal on a basis of the predicted convergence voltage value of the analog signal;

a step of measuring a time period from a generation timing of the ramp wave reference signal to a time before the voltage value of the analog pixel signal intersects with the ramp wave of the reference signal; and a step of deriving a convergence voltage value of the analog signal by adding a voltage value corresponding to the measured time period and a voltage value based on the predicted convergence voltage value.

8. The analog-digital conversion method according to claim 7, wherein
the voltage values of the analog signal are acquired a plurality of times at equal intervals in the settling period of the analog signal.

9. The analog-digital conversion method according to claim 7, wherein
the voltage values of the analog signal are acquired a plurality of times at unequal intervals in the settling period of the analog signal.

10. The analog-digital conversion method according to claim 7, wherein
a gain of an analog-digital converter is adjusted according to luminance information.

11. An imaging device comprising:
a pixel array unit configured by arranging pixels including photoelectric conversion units in a matrix; and
an analog-digital converter configured to convert an analog pixel signal output from the pixel into a digital pixel signal, wherein
the analog-digital converter includes:
a voltage acquisition unit that acquires a voltage value of an analog signal in a settling period of the analog signal;
a calculation unit that calculates a predicted convergence voltage value of the analog signal on a basis of the voltage value of the analog signal acquired by the voltage acquisition unit;
a reference signal generation unit that generates a ramp wave reference signal on a basis of the predicted convergence voltage value calculated by the calculation unit;
a comparison unit that compares the voltage value of the analog signal with the ramp wave of the reference signal;
a measurement unit that measures a time period from a generation timing of the reference signal to a time before the voltage value of the analog signal intersects with the ramp wave of the reference signal; and
an addition unit that derives a convergence voltage value of the analog signal by adding a voltage value corresponding to the time period measured by the measurement unit and a voltage value based on the predicted convergence voltage value.

12. The imaging device according to claim 11, wherein
pixel signal reading directions in an odd-number pixel column and an even-number pixel column are different from each other, and
the analog-digital converter is provided every other pixel column for each reading direction.

13. The imaging device according to claim 12, having a structure in which at least two semiconductor substrates including a first semiconductor substrate and a second semiconductor substrate are laminated, wherein
a pixel array unit is formed on the first semiconductor substrate, and
the analog-digital converter is formed on the second semiconductor substrate.

* * * * *